(12) United States Patent
Huang

(10) Patent No.: US 11,824,047 B2
(45) Date of Patent: Nov. 21, 2023

(54) METHOD FOR FABRICATING SEMICONDUCTOR DEVICE WITH STACKED DIES

(71) Applicant: NANYA TECHNOLOGY CORPORATION, New Taipei (TW)

(72) Inventor: Tse-Yao Huang, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/993,248

(22) Filed: Nov. 23, 2022

(65) Prior Publication Data

US 2023/0079072 A1 Mar. 16, 2023

Related U.S. Application Data

(62) Division of application No. 17/319,257, filed on May 13, 2021, now Pat. No. 11,557,572.

(51) Int. Cl.
*H01L 25/065* (2023.01)
*H01L 25/18* (2023.01)
(Continued)

(52) U.S. Cl.
CPC .... *H01L 25/0657* (2013.01); *H01L 21/76898* (2013.01); *H01L 23/3171* (2013.01); *H01L 24/06* (2013.01); *H01L 24/08* (2013.01); *H01L 24/80* (2013.01); *H01L 25/18* (2013.01); *H01L 25/50* (2013.01); *H01L 21/02063* (2013.01); *H01L 21/02274* (2013.01); *H01L 23/5329* (2013.01); *H01L 24/03* (2013.01); *H01L 24/05* (2013.01); *H01L 24/13* (2013.01); *H01L 24/16* (2013.01); *H01L 24/83* (2013.01); *H01L 24/92* (2013.01); *H01L 2224/0345* (2013.01);
(Continued)

(58) Field of Classification Search
CPC ........... H01L 25/0657; H01L 21/76898; H01L 24/06; H01L 24/08; H01L 21/02063; H01L 2224/08145; H01L 2224/08146; H01L 2224/13025; H01L 2224/16146
See application file for complete search history.

(56) References Cited

U.S. PATENT DOCUMENTS

2011/0248396 A1\* 10/2011 Liu ...................... H01L 25/0657
438/459
2020/0075524 A1\* 3/2020 Seo ......................... H01L 24/14
(Continued)

*Primary Examiner* — Mamadou L Diallo
(74) *Attorney, Agent, or Firm* — Xuan Zhang

(57) ABSTRACT

The present application provides a method for fabricating a semiconductor device including providing a first semiconductor die including a first substrate including a first substrate including a first region and a second region, a plurality of first through substrate vias in the first region, a first circuit layer on the first substrate, and a control circuit on the first region and in the first circuit layer; forming a plurality of through die vias vertically along the first circuit layer and the second region; providing a second semiconductor die including a plurality of second conductive pads substantially coplanar with a top surface of the second semiconductor die; providing a third semiconductor die including a plurality of third conductive pads substantially coplanar with a top surface of the third semiconductor die; flipping the second semiconductor die and bonding the second semiconductor die onto the first circuit layer.

2 Claims, 16 Drawing Sheets

(51) Int. Cl.
  *H01L 25/00* (2006.01)
  *H01L 23/00* (2006.01)
  *H01L 23/31* (2006.01)
  *H01L 21/768* (2006.01)
  *H01L 21/02* (2006.01)
  *H01L 23/532* (2006.01)

(52) U.S. Cl.
  CPC ............... *H01L 2224/03462* (2013.01); *H01L 2224/03831* (2013.01); *H01L 2224/05155* (2013.01); *H01L 2224/05624* (2013.01); *H01L 2224/05647* (2013.01); *H01L 2224/05657* (2013.01); *H01L 2224/05664* (2013.01); *H01L 2224/06181* (2013.01); *H01L 2224/08145* (2013.01); *H01L 2224/08146* (2013.01); *H01L 2224/13025* (2013.01); *H01L 2224/16146* (2013.01); *H01L 2224/80203* (2013.01); *H01L 2224/83203* (2013.01); *H01L 2224/9211* (2013.01); *H01L 2225/06513* (2013.01); *H01L 2225/06544* (2013.01)

(56) References Cited

U.S. PATENT DOCUMENTS

| | | | |
|---|---|---|---|
| 2020/0091063 A1* | 3/2020 | Chen | H01L 25/0657 |
| 2020/0135617 A1* | 4/2020 | Shen | H01L 27/14634 |
| 2021/0082865 A1* | 3/2021 | Baraskar | H01L 25/0657 |
| 2021/0134748 A1* | 5/2021 | Liu | H01L 24/80 |
| 2021/0217729 A1* | 7/2021 | Kandala | H01L 25/50 |
| 2021/0351219 A1* | 11/2021 | Yamagishi | H01L 24/80 |
| 2021/0384137 A1* | 12/2021 | Choi | H01L 24/08 |
| 2021/0391302 A1* | 12/2021 | Kao | H01L 24/08 |
| 2022/0013502 A1* | 1/2022 | Lee | H01L 24/06 |
| 2022/0028834 A1* | 1/2022 | Lee | H01L 25/0652 |
| 2022/0037267 A1* | 2/2022 | Zhang | H10B 43/27 |
| 2022/0077117 A1* | 3/2022 | Yu | H01L 23/485 |
| 2022/0093543 A1* | 3/2022 | Seo | H01L 25/105 |
| 2022/0189921 A1* | 6/2022 | Wuu | H03K 19/20 |
| 2022/0189940 A1* | 6/2022 | Park | H10B 41/30 |
| 2022/0208705 A1* | 6/2022 | Chen | H10B 43/27 |

* cited by examiner

METHOD FOR FABRICATING SEMICONDUCTOR DEVICE WITH STACKED DIES

CROSS-REFERENCE TO RELATED APPLICATION

This application is a divisional application of U.S. Non-Provisional application Ser. No. 17/319,257 filed 13 May 2021, which is incorporated herein by reference in its entirety.

TECHNICAL FIELD

The present disclosure relates to a method for fabricating a semiconductor device, and more particularly, to a method for fabricating a semiconductor device with stacked dies.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a first semiconductor die including a first substrate including a first region and a second region, a first circuit layer positioned on the first substrate, a control circuit positioned on the first region of the first substrate and positioned in the first circuit layer; and a plurality of through die vias vertically positioned along the first circuit layer and the second region of the first substrate; a second semiconductor die stacked on the first semiconductor die and including a plurality of second conductive pads respectively electrically connected to the plurality of through die vias and the control circuit; and a third semiconductor die stacked under the first semiconductor die and including a plurality of third conductive pads respectively electrically connected to the plurality of through die vias and the control circuit; wherein the plurality of through die vias, the plurality of second conductive pads, and the plurality of third conductive pads together configure a plurality of transmission channels through which the control circuit is capable to access the second semiconductor die and the third semiconductor die.

In some embodiments, the second semiconductor die and the third semiconductor die are memory dies.

In some embodiments, the first circuit layer includes a plurality of first device elements positioned on the first substrate and positioned in the first circuit layer; a plurality of first interconnect layers horizontally positioned above the first substrate, positioned in the first circuit layer, and separated from each other; a plurality of first conductive pads positioned in the first circuit layer, substantially coplanar with a top surface of the first circuit layer, and directly contacting the plurality of second conductive pads positioned above the first region of the first substrate; and a plurality of first conductive vias respectively connecting the adjacent first device element and first interconnect layer, the adjacent first interconnect layers, and the adjacent first conductive pad and first interconnect layer.

In some embodiments, the semiconductor device includes a first bottom passivation layer positioned between the first substrate and the third semiconductor die. The plurality of through die vias are vertically positioned along the first bottom passivation layer and directly contacting the plurality of third conductive pads positioned under the second region of the first substrate.

In some embodiments, the semiconductor device includes a plurality of first through substrate vias positioned along the first region of the first substrate and electrically connected the plurality of first device elements and the plurality of third conductive pads under the first region of the first substrate.

In some embodiments, the semiconductor device includes a first bottom passivation layer and a plurality of first bottom conductive pads. The first bottom passivation layer is positioned between the first substrate and the third semiconductor die. The plurality of first bottom conductive pads are positioned in the first bottom passivation layer and respectively contacting the plurality of first through substrate vias and the plurality of third conductive pads under the first region of the first substrate.

In some embodiments, the second semiconductor die includes a second circuit layer positioned on the first circuit layer. The plurality of second conductive pads are positioned in the second circuit layer and substantially coplanar with a bottom surface of the second circuit layer; and a second substrate positioned on the second circuit layer.

In some embodiments, a thickness of the second substrate is different from a thickness of the first substrate.

In some embodiments, the semiconductor device includes a plurality of second through substrate vias positioned along the second substrate and electrically connected to the plurality of second conductive pads.

In some embodiments, the semiconductor device includes a plurality of connectors respectively positioned on the plurality of second through substrate vias.

In some embodiments, the second semiconductor die includes a plurality of first capacitors positioned in the second circuit layer, above the second region of the first substrate, and electrically connected to the plurality of second conductive pads.

In some embodiments, the plurality of first through substrate vias respectively include a filler layer positioned along the first region of the first substrate; and two isolation layers positioned on two sides of the filler layer and along the first region of the first substrate.

In some embodiments, the semiconductor device includes two barrier layers respectively positioned between the filler layer and the two isolation layers.

In some embodiments, the semiconductor device includes two adhesion layers respectively positioned between the filler layer and the two barrier layers.

In some embodiments, the semiconductor device includes two seed layers respectively positioned between the filler layer and the two adhesion layers.

Another aspect of the present disclosure provides a method for fabricating a semiconductor device including providing a first semiconductor die including a first substrate including a first substrate including a first region and a second region, a plurality of first through substrate vias in the first region of the first substrate, a first circuit layer on the first substrate, and a control circuit on the first region of the first substrate and in the first circuit layer; forming a plurality of through die vias vertically along the first circuit layer and the second region of the first substrate; providing a second semiconductor die including a plurality of second conductive pads substantially coplanar with a top surface of the second semiconductor die; providing a third semiconductor die including a plurality of third conductive pads substantially coplanar with a top surface of the third semiconductor die; flipping the second semiconductor die and bonding the second semiconductor die onto the first circuit layer to electrically connect the plurality of second conductive pads to the control circuit and the plurality of through die vias; and bonding the first semiconductor die onto the third semiconductor die to electrically connect the control circuit and the plurality of through die vias to the plurality of third conductive pads.

In some embodiments, the second semiconductor die and the third semiconductor die are memory dies.

In some embodiments, the method for fabricating the semiconductor device includes forming a plurality of first through substrate vias in the first substrate and electrically connected to the control circuit.

In some embodiments, the method for fabricating the semiconductor device includes performing a thinning process to reduce a thickness of the first substrate and expose the plurality of first through substrate vias, forming a first bottom passivation layer to cover the first substrate and the plurality of first through substrate vias, and forming a plurality of first bottom conductive pads in the first bottom passivation layer to electrically connect to the plurality of first through substrate vias. The plurality of through die vias are formed vertically along the first circuit layer, the second region of the first substrate, and the first bottom passivation layer. The plurality of first bottom conductive pads are electrically connected to the plurality of third conductive pads.

In some embodiments, the first bottom passivation layer includes polybenzoxazole, polyimide, benzocyclobutene, ajinomoto buildup film, solder resist film, silicon nitride, silicon oxide, silicon oxynitride, silicon nitride oxide, phosphosilicate glass, borosilicate glass, or boron-doped phosphosilicate glass.

Due to the design of the semiconductor device of the present disclosure, the electrical paths between different dies may be significantly reduced. Therefore, the power consumption of the semiconductor device may be reduced. In addition, separating the control circuit from the memory dies may reduce the complexity of manufacturing of the memory dies. Besides, the control circuit may be fabricated with a process that yields power-efficient high-speed circuitry. As a result, the overall manufacturing efficiency may be improved, and the overall manufacturing complexity may be reduced.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
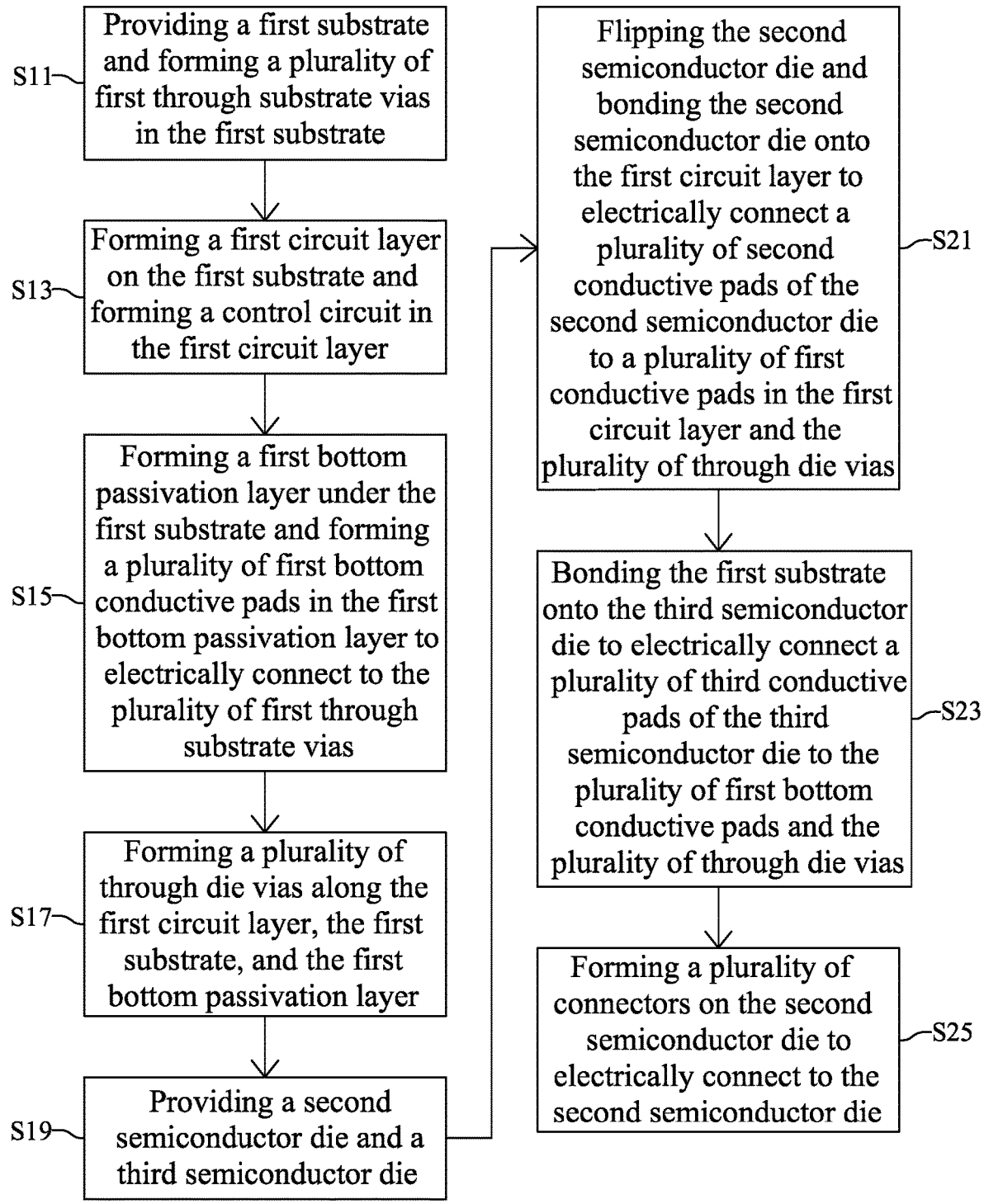
FIG. 1 illustrates, in a flowchart diagram form, a method for fabricating a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms.

Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

It should be noted that, in the description of the present disclosure, a surface of an element (or a feature) located at the highest vertical level along the dimension Z is referred to as a top surface of the element (or the feature). A surface of an element (or a feature) located at the lowest vertical level along the dimension Z is referred to as a bottom surface of the element (or the feature).

FIG. 1 illustrates, in a flowchart diagram form, a method 10 for fabricating a semiconductor device 1A in accordance with one embodiment of the present disclosure. FIGS. 2 to 11 illustrate, in schematic cross-sectional view diagrams, a flow for fabricating the semiconductor device 1A in accordance with one embodiment of the present disclosure.

Figure 2:
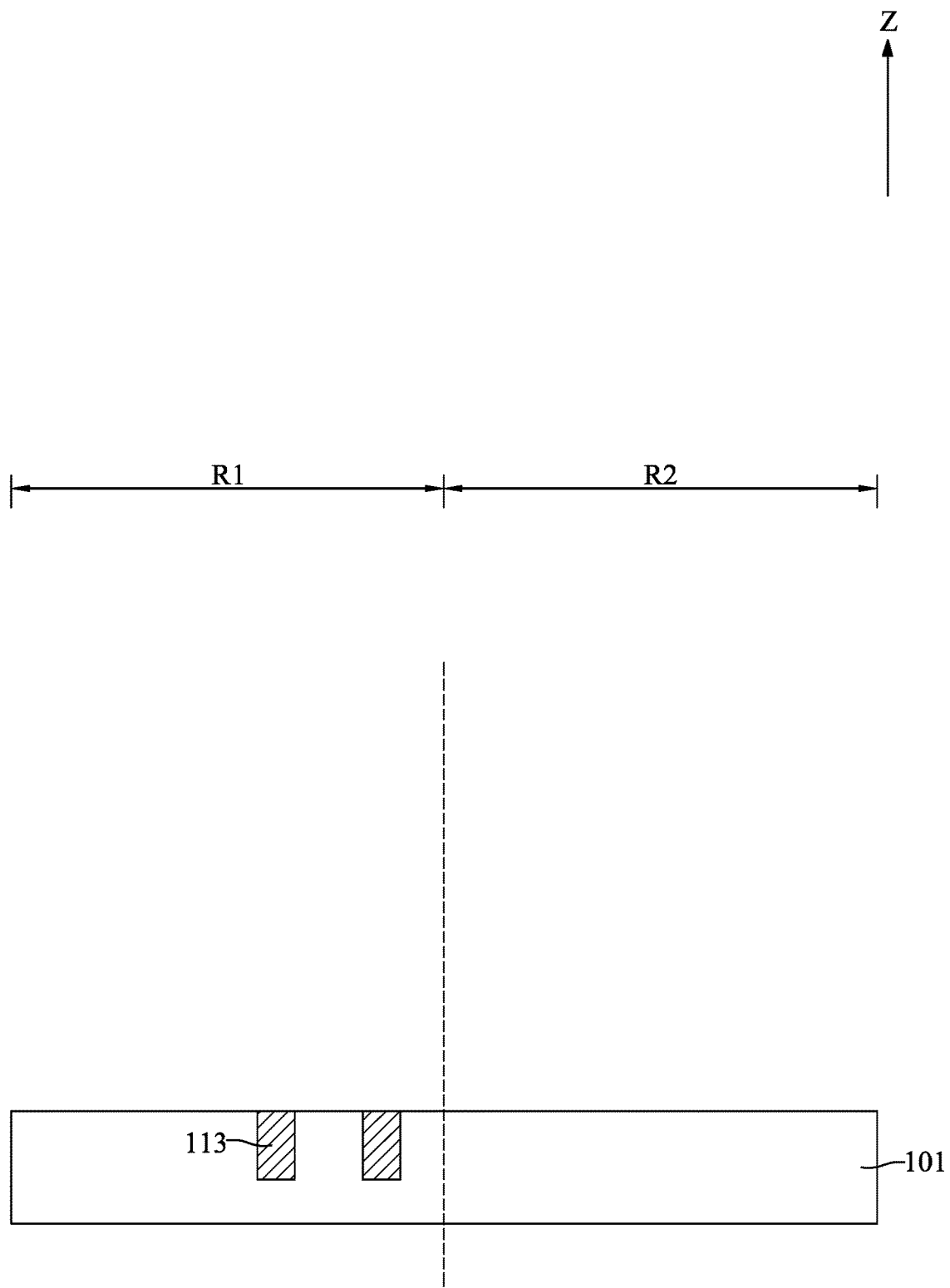
FIGS. 2 to 11 illustrate, in schematic cross-sectional view diagrams, a flow for fabricating the semiconductor device in accordance with one embodiment of the present disclosure.

With reference to FIGS. 1 and 2, at step S11, a first substrate 101 may be provided and a plurality of first through substrate vias 113 may be formed in the first substrate 101.

With reference to FIG. 2, the first substrate 101 may be a bulk semiconductor substrate. The bulk semiconductor substrate may be formed of, for example, an elementary semiconductor such as silicon or germanium, or a compound semiconductor such as silicon germanium, silicon carbide, gallium arsenide, gallium phosphide, indium phosphide, indium arsenide, indium antimonide, or other III-V compound semiconductor or II-VI compound semiconductor.

With reference to FIG. 2, the first substrate 101 may include a first region R1 and a second region R2. In some embodiments, the second region R2 may be next to the first region R1. In some embodiments, in a top-view perspective (not shown), the second region R2 may be the central region of the first substrate 101. The first region R1 may be the peripheral region of the first substrate 101 which is surrounding the central region.

It should be noted that, in the description of the present disclosure, the first region R1 may comprise a portion of the first substrate 101 and spaces above and under the portion of the first substrate 101. Describing an element as being disposed on the first region R1 means that the element is disposed on a top surface of the portion of the first substrate 101. Describing an element as being disposed in the first region R1 means that the element is disposed in the portion of the first substrate 101; however, a top surface of the element may be even with the top surface of the portion of the first substrate 101. Describing an element as being disposed above the first region R1 means that the element is disposed above the top surface of the portion of the first substrate 101. Describing an element as being disposed under the first region R1 means that the element is disposed under the bottom surface of the portion of the first substrate 101; wherein the element contacts the bottom surface of the portion of the first substrate 101 or is distant from the bottom surface of the portion of the first substrate 101. Accordingly, the second region R2 may comprise another portion of the first substrate 101 and spaces above and under the other portion of the first substrate 101.

With reference to FIG. 2, the plurality of first through substrate vias 113 may be formed in the first substrate 101. In some embodiments, the plurality of first through substrate vias 113 only formed in the first region R1 of the first substrate 101. In some embodiments, the plurality of first through substrate vias 113 may be formed in both the first region R1 and the second region R2 of the first substrate 101. For brevity, clarity, and convenience of description, only one first through substrate via 113 is described. In some embodiments, the width of the first through substrate via 113 may be between about 1 µm and about 22 µm or between about 5 µm and about 15 µm. In some embodiments, the depth of the first through substrate via 113 may be between about 20 µm and about 160 µm or between about 50 µm and about 130 µm.

In some embodiments, the first through substrate via 113 may be extending from the top surface of the first substrate 101 toward the bottom surface of the first substrate 101. In some embodiments, the first through substrate via 113 may be formed by a via-first process. In some embodiments, the first through substrate via 113 may be formed of, for example, a doped semiconductor material such as doped polycrystalline silicon, doped polycrystalline germanium, doped polycrystalline silicon germanium, or other suitable conductive material. It should be noted that the material used for the first through substrate via 113 should have sufficient thermal stability to bear the high temperature treatment during the front-end-of line procedure.

Figure 3:
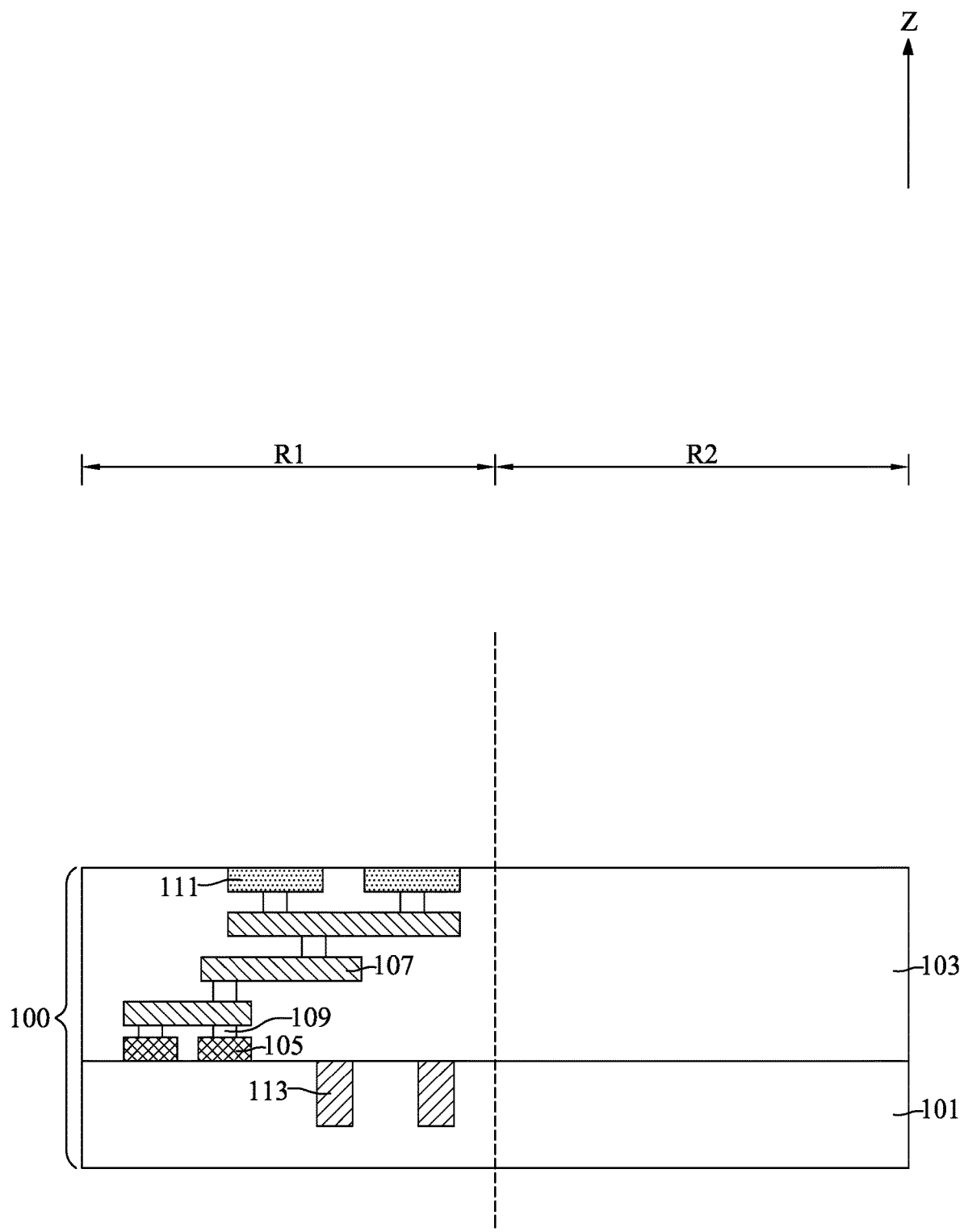

With reference to FIGS. 1 and 3, at step S13, a first circuit layer 103 may be formed on the first substrate 101 and a control circuit may be formed in the first circuit layer 103.

With reference to FIG. 3, the first circuit layer 103 may be formed on the first substrate 101. The first circuit layer 103 may include inter-layer dielectric layers and/or inter-metal dielectric layers containing the control circuit and/or other functional units. A functional unit, in the description of the present disclosure, generally refers to functionally related circuitry that has been partitioned for functional purposes into a distinct unit. In some embodiments, functional units may be typically highly complex circuits such as processor cores, memory controllers, or accelerator units. In some other embodiments, the complexity and functionality of a functional unit may be more or less complex.

In some embodiments, the control circuit may be referred to as the one of the functional units. In some embodiments, the control circuit may be the only functional unit contained in the first circuit layer 103. In some embodiments, the control circuit may be only located on the first region R1 of the first substrate 101. In some embodiments, the control circuit may be located on both the first region R1 and the second region R2 of the first substrate 101. In some embodiments, the control circuit (or the other functional units) may include a plurality of first device elements 105, a plurality of first interconnect layers 107, a plurality of first conductive vias 109, and a plurality of first conductive pads 111. In some embodiments, the control circuit may be electrically coupled to the plurality of first through substrate vias 113.

With reference to FIG. 3, the first device element 105 may be transistors such as complementary metal-oxide-semiconductor transistors, metal-oxide-semiconductor field-effect transistors, fin field-effect-transistors, the like, or a combination thereof. The plurality of first interconnect layers 107 may be separated from each other and may be horizontally disposed in the inter-layer dielectric layers and/or inter-metal dielectric layers along the direction Z. In the present embodiment, the topmost first interconnect layers 107 may be designated as the plurality of first conductive pads 111. The top surfaces of the plurality of first conductive pads 111 may be substantially coplanar with the top surface of the first circuit layer 103. The plurality of first conductive vias 109 may connect adjacent first interconnect layers 107 along the direction Z, adjacent first device element 105 and first interconnect layer 107, and adjacent first conductive pad 111 and first interconnect layer 107. In some embodiments, the plurality of first conductive vias 109 may improve heat dissipation in the first circuit layer 103 and may provide structure support in the first circuit layer 103.

It should be noted that, in the description of the present disclosure, the number of the first device element 105, the first interconnect layer 107, the first conductive via 109, and the first conductive pad 111 are just for illustration purpose. The number of aforementioned conductive features may be more or less than that shown in FIG. 3.

In some embodiments, the inter-layer dielectric layers and/or the inter-metal dielectric layers may be formed of, for example, silicon oxide, borophosphosilicate glass, undoped silicate glass, fluorinated silicate glass, low-k dielectric materials, the like, or a combination thereof. The low-k dielectric materials may have a dielectric constant less than 3.0 or even less than 2.5. In some embodiments, the low-k dielectric materials may have a dielectric constant less than 2.0. The inter-layer dielectric layers and/or the inter-metal dielectric layers may be formed by deposition processes such as chemical vapor deposition, plasma-enhanced chemical vapor deposition, or the like. Planarization processes may be performed after the deposition processes to remove excess material and provide a substantially flat surface for subsequent processing steps. The control circuit and the plurality of functional units may be formed during the formation of the inter-layer dielectric layers and/or the inter-metal dielectric layers.

It should be noted that, in the description of the present disclosure, a surface is "substantially flat" if there exists a horizontal plane from which the surface does not deviate by more than three times the root mean square roughness of the surface.

In some embodiments, the plurality of first interconnect layers 107, the plurality of first conductive vias 109, and the plurality of first conductive pads 111 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof.

For brevity, clarity, and convenience of description, only one first conductive pad 111 is described.

In some embodiments, a pad opening (not shown in FIG. 3) may be formed in the first circuit layer 103 and a conductive material may be formed to fill the pad opening to form the first conductive pad 111. The pad opening may be formed by a photolithography process and a subsequent etching process. The top surface of the topmost first conductive via 109 may be exposed through the pad opening.

In some embodiments, the etching process may be an anisotropic dry etching process using argon and tetrafluoromethane as etchants. The process temperature of the etching process may be between about 120° C. and about 160° C. The process pressure of the etching process is between about 0.3 Torr and about 0.4 Torr. The process duration of the etching process may be between about 33 and about 39 seconds. Alternatively, in some embodiments, the etching process may be an anisotropic dry etching process using helium and nitrogen trifluoride as etchants. The process temperature of the etching process may be between about 80° C. and about 100° C. The process pressure of the etching process is between about 1.2 Torr and about 1.3 Torr. The process duration of the etching process may be between about 20 seconds and about 30 seconds.

In some embodiments, a cleaning process may be performed after the formation of the pad opening. The cleaning process may include applying a mixture of hydrogen and argon as a remote plasma source with a process temperature between about 250° C. and about 350° C. and a process pressure ranging between about 1 Torr and about 10 Torr in the presence of a bias energy applied to the equipment performing the cleaning process. The bias energy may be between about 0 W and 200 W. The cleaning process may remove oxide, originating from oxidation by oxygen in the air, from the top surface of the topmost conductive feature (e.g., the first conductive via 109) exposed through the pad opening without damaging the topmost conductive feature.

A passivation process may be subsequently performed over the first circuit layer 103 and the pad opening. The passivation process may include soaking the intermediate semiconductor device with a precursor such as dimethylaminotrimethylsilane, tetramethylsilane, or the like at a process temperature between about 200° C. and about 400° C. Ultraviolet radiation may be used to facilitate the passivation process. The passivation process may passivate sidewalls of the first circuit layer 103 exposed through the pad opening by sealing surface pores thereof to reduce undesirable sidewall growth, which may affect the electric characteristics of the semiconductor device 1A, during subsequent processing steps. As a result, the performance and reliability of the semiconductor device 1A may be increased.

In some embodiments, the pad opening may be sequentially filled with the conductive material by sputtering, electroplating, or electroless plating. For example, when the pad opening is filled by sputtering using an aluminum-copper material as source, the process temperature of sputtering may be between about 100° C. and about 400° C. The process pressure of sputtering may be between about 1 mTorr and about 100 mTorr. After sputtering, an etching process may be performed to trim the filled conductive material to form the first conductive pad 111. The etching process may use chlorine and argon as etchants. The etchant flow of chlorine may be between about 10 sccm (standard cubic centimeters to minute) and about 30 sccm. The etchant flow of argon may be between about 900 sccm and about 1100 sccm. The process temperature of the etching process may be between about 50° C. and about 200° C. The process pressure of the etching process may be between about 50 mTorr and about 10 Torr. The process duration of the etching process may be between about 30 seconds and about 200 seconds. In this example, the first conductive pad 111 may have a thickness between about 400 nm and about 1100 nm and the first conductive pad 111 may be formed of aluminum-copper alloy. Small quantities of copper in aluminum may improve the electromigration resistance and further reduce the occurrence of hillocks, that is small protrusions of aluminum on a surface of a thin film layer of aluminum.

For another example, the pad opening may be filled by an electroplating process using a plating solution. The plating solution may include copper sulfate, copper methane sulfonate, copper gluconate, copper sulfamate, copper nitrate, copper phosphate, or copper chloride. The pH of the plating solution may be between about 2 and about 6 or between about 3 and about 5. The process temperature of the electroplating process may be maintained between about 40° C. and about 75° C. or between about 50° C. and about 70° C. In this example, the first conductive pad 111 may be formed of copper.

In some embodiments, the plating solution may include accelerators, suppressors, or levelers. The accelerators may include a polar sulfur, oxygen, or nitrogen functional group that help to increase deposition rates and may promote dense nucleation. The accelerators may be present at a low concentration level, for example, between about 0 and about 200 ppm. The suppressors are additives that reduce the plating rate and are usually present in the plating bath at higher concentrations, for example, between about 5 ppm and about 1000 ppm. The suppressors may be polymeric surfactants with high molecular weight, such as polyethylene glycol.

The suppressors may slow down the deposition rate by adsorbing on the surface and forming a barrier layer to the copper ions. Because of their large size and low diffusion rate, the suppressors are less likely to reach the lower part of the pad opening. Therefore, most of the suppressing effect may occur at the upper part of the pad opening, helping to reduce overburden of the filling material (e.g., copper) and avoid the pad opening "closing".

The leveler may be used to improve filling performance, decrease the surface roughness, and prevent copper deposition at the upper part of the pad opening. The levelers may be present in a small concentration, for example, between about 1 ppm and about 100 ppm. The levelers may be, for example, 3-mercapto-1-propanesulfonate, (3-sulfopropyl) disulfide, or 3,3-thiobis (1-propanesulfonate).

In some embodiments, the first conductive pad 111 may include a bottom portion and a top portion. The bottom portion may be formed on the lower part of the pad opening. The top portion may be formed on the bottom portion and completely filled the pad opening. The bottom portion may include nickel. The top portion may include palladium, cobalt, or a combination thereof.

In some embodiments, the layer of first circuit layer 103 where the first conductive pad 111 disposed may be formed of a polymeric material such as polybenzoxazole, polyimide, benzocyclobutene, ajinomoto buildup film, solder resist film, or the like. The polymeric material (e.g., polyimide) may have a number of attractive characteristics such as the ability to fill openings of high aspect ratio, a relatively low dielectric constant (about 3.2), a simple depositing process, the reduction of sharp features or steps in the underlying layer, and high temperature tolerance after curing. In addition, some photosensitive polymeric material (e.g., photosensitive polyimide) may have all aforementioned characteristics and may be patterned like a photoresist mask and may, after patterning and etching, remain on the surface on which the photosensitive polymeric material has been deposited to serve as part of a passivation layer.

Figure 4:
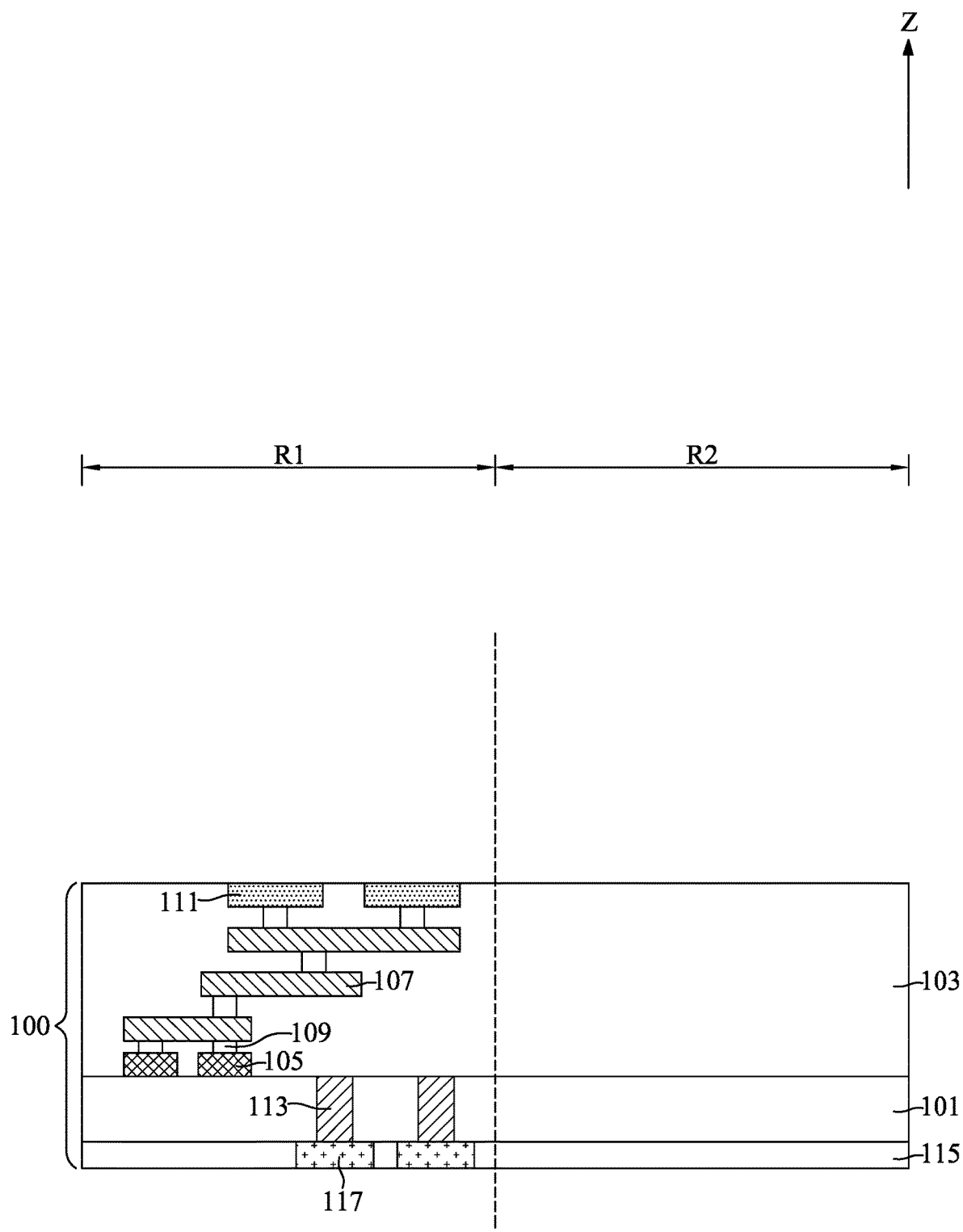

With reference to FIGS. 1 and 4, at step S15, a first bottom passivation layer 115 may be formed under the first substrate 101 and a plurality of first bottom conductive pads 117 may be formed in the first bottom passivation layer 115 to electrically connect to the plurality of first through substrate vias 113.

With reference to FIG. 4, a first bottom passivation layer 115 may be formed under the first substrate 101 and directly contacting the bottom surface of the first substrate 101. In some embodiments, the first bottom passivation layer 115 may include polybenzoxazole, polyimide, benzocyclobutene, ajinomoto buildup film, solder resist film, the like, or a combination thereof. The first bottom passivation layer 115 formed of polymeric material may have a number of attractive characteristics such as the ability to fill openings of high aspect ratio, a relatively low dielectric constant (about 3.2), a simple depositing process, the reduction of sharp features or steps in the underlying layer, and high temperature tolerance after curing. In some other embodiments, the first bottom passivation layer 115 may be a dielectric layer. The dielectric layer may include a nitride such as silicon nitride, an oxide such as silicon oxide, an oxynitride such as silicon oxynitride, silicon nitride oxide, phosphosilicate glass, borosilicate glass, boron-doped phosphosilicate glass, or the like, or a combination thereof.

In some embodiments, the first bottom passivation layer 115 may be formed by, for example, spin-coating, lamination, deposition, or the like. The deposition may include chemical vapor deposition such as plasma-enhanced chemical vapor deposition. The process temperature of the plasma-enhanced chemical vapor deposition may be between about 350° C. and about 450° C. The process pressure of the plasma-enhanced chemical vapor deposition may be between about 2.0 Torr and about 2.8 Torr. The process duration of the plasma-enhanced chemical vapor deposition may be between about 8 seconds and about 12 seconds.

With reference to FIG. 4, a plurality of first bottom conductive pads 117 may be formed along the first bottom passivation layer 115 and electrically connected to the plurality of first through substrate vias 113, respectively and correspondingly. In some embodiments, the plurality of first bottom conductive pads 117 may be only formed under the first region R1 of the first substrate 101. In some embodiments, the plurality of first bottom conductive pads 117 may be formed under both the first region R1 and the second region R2 of the first substrate 101. In some embodiments, the plurality of first bottom conductive pads 117 may be formed of a procedure similar to the first conductive pad 111, and descriptions thereof are not repeated herein. In some embodiments, the plurality of first bottom conductive pads 117 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof.

In some embodiments, the first bottom passivation layer 115 and the plurality of first bottom conductive pads 117 may be formed in the assistance of a first carrier substrate. Specifically, the intermediate semiconductor device illustrated in FIG. 3 may be formed on the first carrier substrate and then be flipped in an up-side down manner. The first bottom passivation layer 115 and the plurality of first bottom conductive pads 117 may be subsequently formed on the first substrate 101. After the formation of the first bottom passivation layer 115 and the plurality of first bottom conductive pads 117, the first carrier substrate may be removed, and the intermediate semiconductor device may be flipped back.

In some embodiments, the first bottom passivation layer 115 and the plurality of first bottom conductive pads 117 may be omitted.

Figure 5:
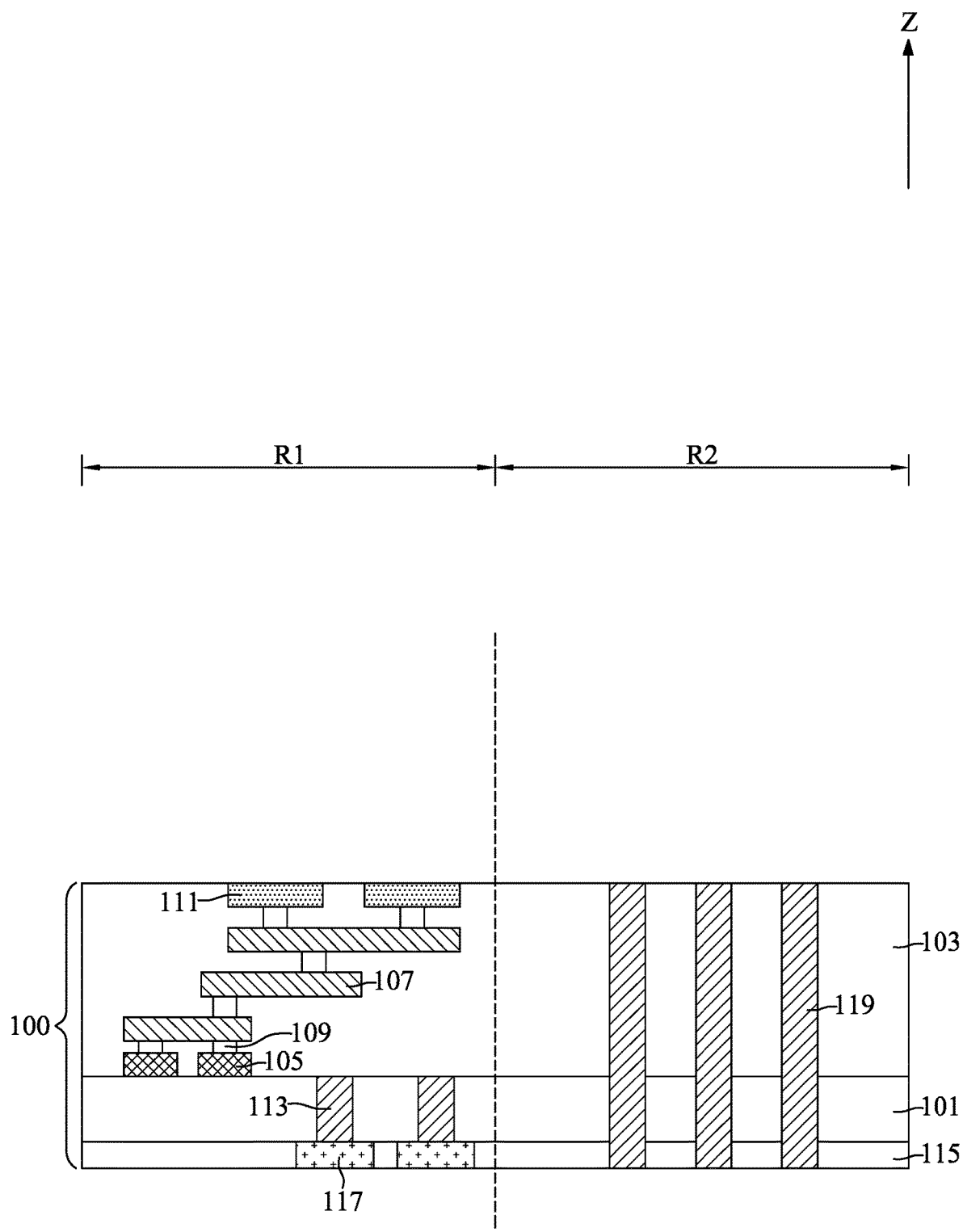

With reference to FIGS. 1 and 5, at step S17, a plurality of through die vias 119 may be formed along the first circuit layer 103, the first substrate 101, and the first bottom passivation layer 115.

For brevity, clarity, and convenience of description, only one through die via 119 is described.

With reference to FIG. 5, the sidewalls of the through die via 119 may be substantially vertical. In some embodiments, the sidewalls of the through die via 119 may be tapered. For example, an angle between the sidewall of the through die via 119 and the top surface of the first circuit layer 103 may be between about 85 degree and about 88 degree. In some embodiments, the through die via 119 may be formed by forming a via opening (not shown in FIG. 5) along the first circuit layer 103, the first substrate 101, and the first bottom passivation layer 115. The via opening may be formed by, for example, laser drilling, powder blast micromachining, deep reactive ion etching, or wet etching using hydroxides such as potassium hydroxide, sodium hydroxide, rubidium hydroxide, ammonium hydroxide, or tetra methyl ammonium hydroxide. The via opening may be subsequently filled to form the through die via 119 by, for example, electroplating. In some embodiments, the through die via 119 may be formed in the assistance of the first carrier substrate.

In some embodiments, the through die via 119 may be formed by vertically stacking first conductive vias 109 in the first circuit layer 103, the first through substrate via 113 in the first substrate 101, and the first bottom conductive pad 117 in the first bottom passivation layer 115.

Figure 6:
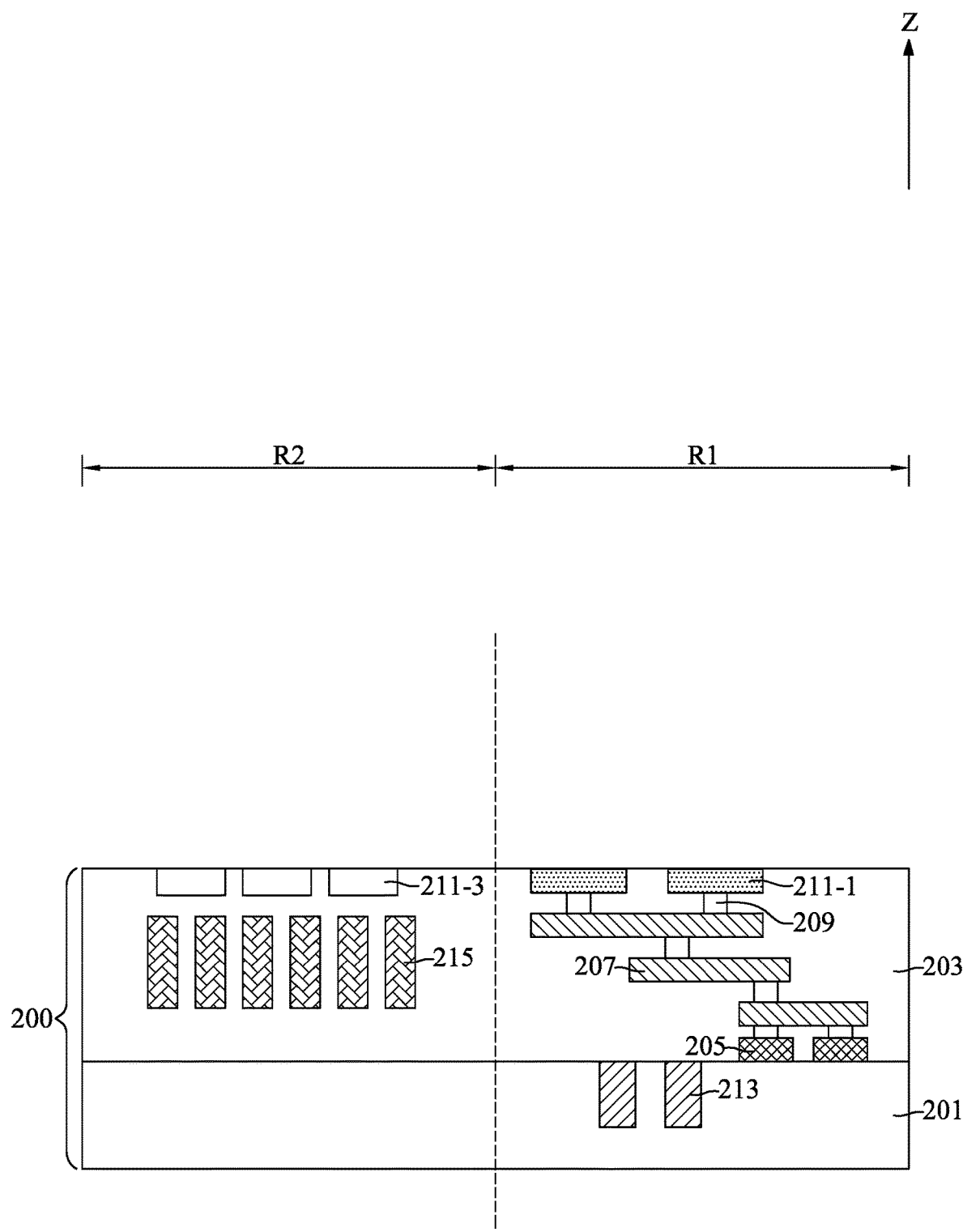
Figure 7:
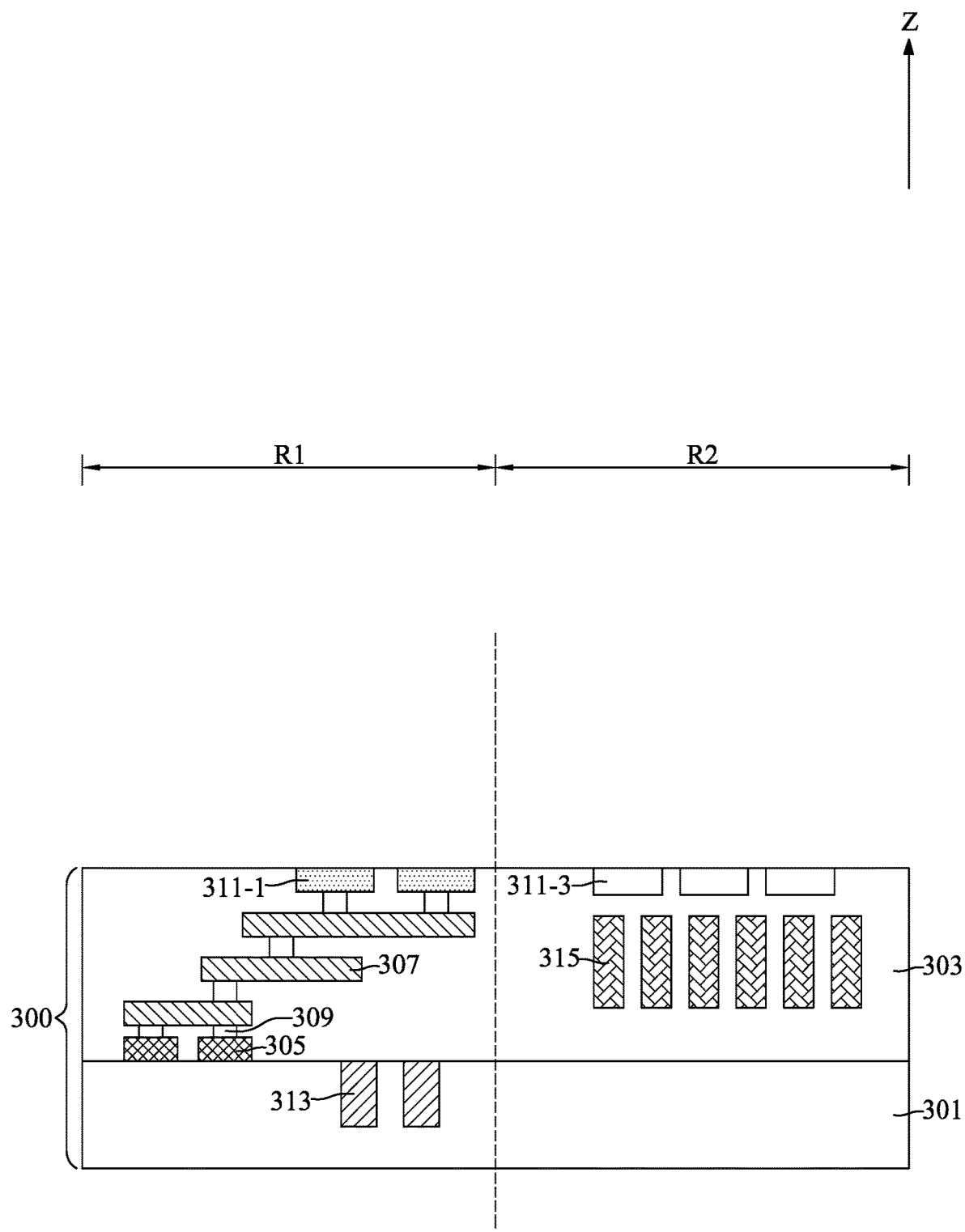

With reference to FIGS. 1, 6, and 7, at step S19, a second semiconductor die 200 and a third semiconductor die 300 may be provided.

With reference to FIG. 6, the second semiconductor die 200 may include a second substrate 201, a second circuit layer 203, a plurality of second device elements 205, a plurality of second interconnect layers 207, a plurality of second conductive vias 209, a plurality of second conductive pads 211-1, 211-3, a plurality of second through substrate vias 213, and a plurality of first capacitors 215.

With reference to FIG. 6, the second substrate 201 may have a structure similar to the first substrate 101 and may be formed of a material similar to the first substrate 101, and descriptions thereof are not repeated herein. The plurality of second through substrate vias 213 may be formed in the second substrate 201 with a procedure similar to the first through substrate via 113 illustrated in FIG. 2, and descriptions thereof are not repeated herein. The plurality of second through substrate vias 213 may be electrically connected to the plurality of second device elements 205. In some embodiments, the plurality of second through substrate vias 213 may be omitted.

With reference to FIG. 6, the second circuit layer 203 may be formed on the second substrate 201 and may include inter-layer dielectric layers and/or inter-metal dielectric layers containing the plurality of second device elements 205, the plurality of second interconnect layers 207, the plurality of second conductive vias 209, the plurality of second conductive pads 211-1, 211-3, and the plurality of first capacitors 215. The plurality of second device elements 205 may be transistors such as complementary metal-oxide-semiconductor transistors, metal-oxide-semiconductor field-effect transistors, fin field-effect-transistors, the like, or a combination thereof.

With reference to FIG. 6, the plurality of second interconnect layers 207 may be separated from each other and may be horizontally disposed in the inter-layer dielectric layers and/or inter-metal dielectric layers of the second circuit layer 203 along the direction Z. In the present embodiment, the topmost second interconnect layers 207 may be designated as the plurality of second conductive pads 211-1, 211-3. The top surfaces of the plurality of second conductive pads 211-1, 211-3 may be substantially coplanar with the top surface of the second circuit layer 203. The plurality of second conductive vias 209 may connect adjacent second interconnect layers 207 along the direction Z, adjacent second device element 205 and second interconnect layer 207, adjacent second conductive pads 211-1, 211-3 and second interconnect layer 207, and adjacent second conductive pad 211-1, 211-3 and first capacitor 215.

Each of the plurality of first capacitors 215 may include an insulator-conductor-insulator structure and may be electrically coupled to the plurality of second conductive pads 211-1, 211-3 and the plurality of second device elements 205, respectively and correspondingly.

The plurality of second device elements 205, the plurality of second interconnect layers 207, the plurality of second conductive vias 209, the plurality of second conductive pads 211-1, 211-3, and the plurality of first capacitors 215 may together configure functional units of the second semiconductor die 200. In the present embodiment, the functional units of the second semiconductor die 200 may cooperate together and provide a memory functionality. The configuration of aforementioned elements of the second semiconductor die 200 may be referred to as the layout of the second semiconductor die 200. In some embodiments, the functional units of the second semiconductor die 200 may only include core storage circuitry such as I/O and clocking circuit. The functional units of the second semiconductor die 200 may not include any control circuit or high-speed circuitry.

In some embodiments, the second conductive pads 211-1 may be at a first region R1 of the second substrate 201 and the second conductive pads 211-3 may be at a second region R2 of the second substrate 201. The second through substrate via 213 may be only above the first region R1 of the second substrate 201. The plurality of first capacitors 215 may be only above the second region R2 of the second substrate 201. In some embodiments, in a top-view perspective (not shown), the first region R1 of the second substrate 201 may be the peripheral region and the second region R2 of the second substrate 201 may be the central region surrounded by the peripheral region.

With reference to FIG. 7, the third semiconductor die 300 may have a structure similar to the second semiconductor die 200. The third semiconductor die 300 may include a third substrate 301, a third circuit layer 303, a third device element 305, a third interconnect layer 307, a plurality of third conductive vias 309, a plurality of third conductive pads 311-1, 311-3, a plurality of third through substrate vias 313, and a plurality of second capacitors 315.

For example, the third substrate 301 may have a structure similar to the second substrate 201 and may be formed of a material similar to the second substrate 201. Other elements of the third semiconductor die 300 may have structure similar to the corresponding elements of the second semiconductor die 200, and descriptions thereof are not repeated herein.

The plurality of third device elements 305, the plurality of third interconnect layers 307, the plurality of third conductive vias 309, the plurality of third conductive pads 311-1, 311-3, and the plurality of second capacitors 315 may together configure functional units of the third semiconductor die 300. In the present embodiment, the functional units of the third semiconductor die 300 may cooperate together and provide a memory functionality. The configuration of aforementioned elements of the third semiconductor die 300 may be referred to as the layout of the third semiconductor die 300. In some embodiments, the layout of the second semiconductor die 200 and the layout of the third semiconductor die 300 are different. For example, the layout of the second semiconductor die 200 and the layout of the third semiconductor die 300 are symmetrical to each other. For another example, the layout of the second semiconductor die 200 may be reflection symmetrical with respect to the layout of the third semiconductor die 300.

In some embodiments, the functional units of the third semiconductor die 300 may only include core storage circuitry such as I/O and clocking circuit. The functional units of the third semiconductor die 300 may not include any control circuit or high-speed circuitry.

In some embodiments, the third conductive pads 311-1 may be above a first region R1 of the third substrate 301 and the third conductive pads 311-3 may be above a second region R2 of the third substrate 301. The third through substrate via 313 may be only at the first region R1 of the third substrate 301. The plurality of second capacitors 315 may be only at the second region R2 of the third substrate 301. In some embodiments, in a top-view perspective (not shown), the first region R1 of the third substrate 301 may be the peripheral region and the second region R2 of the third substrate 301 may be the central region surrounded by the peripheral region.

Figure 8:
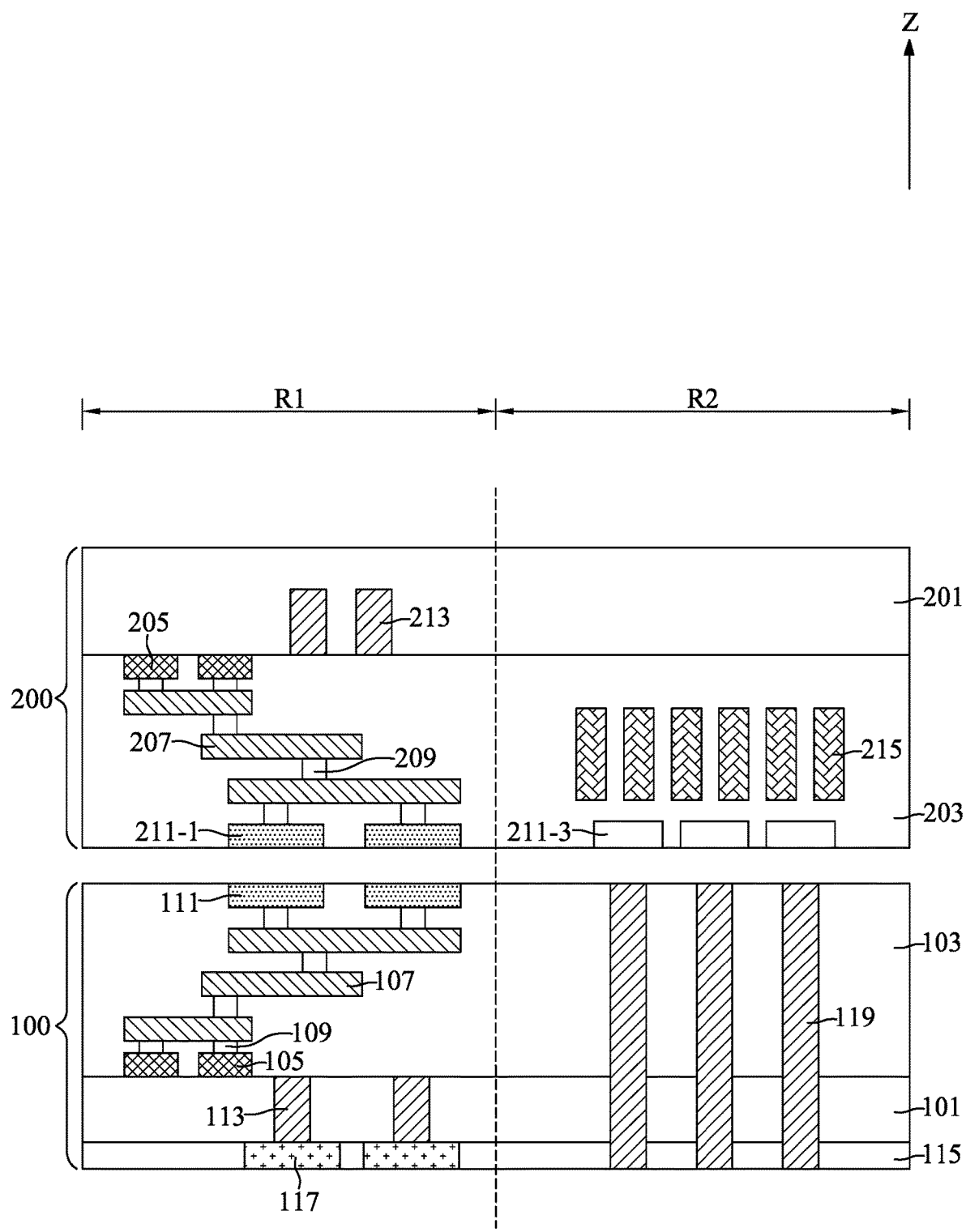
Figure 9:
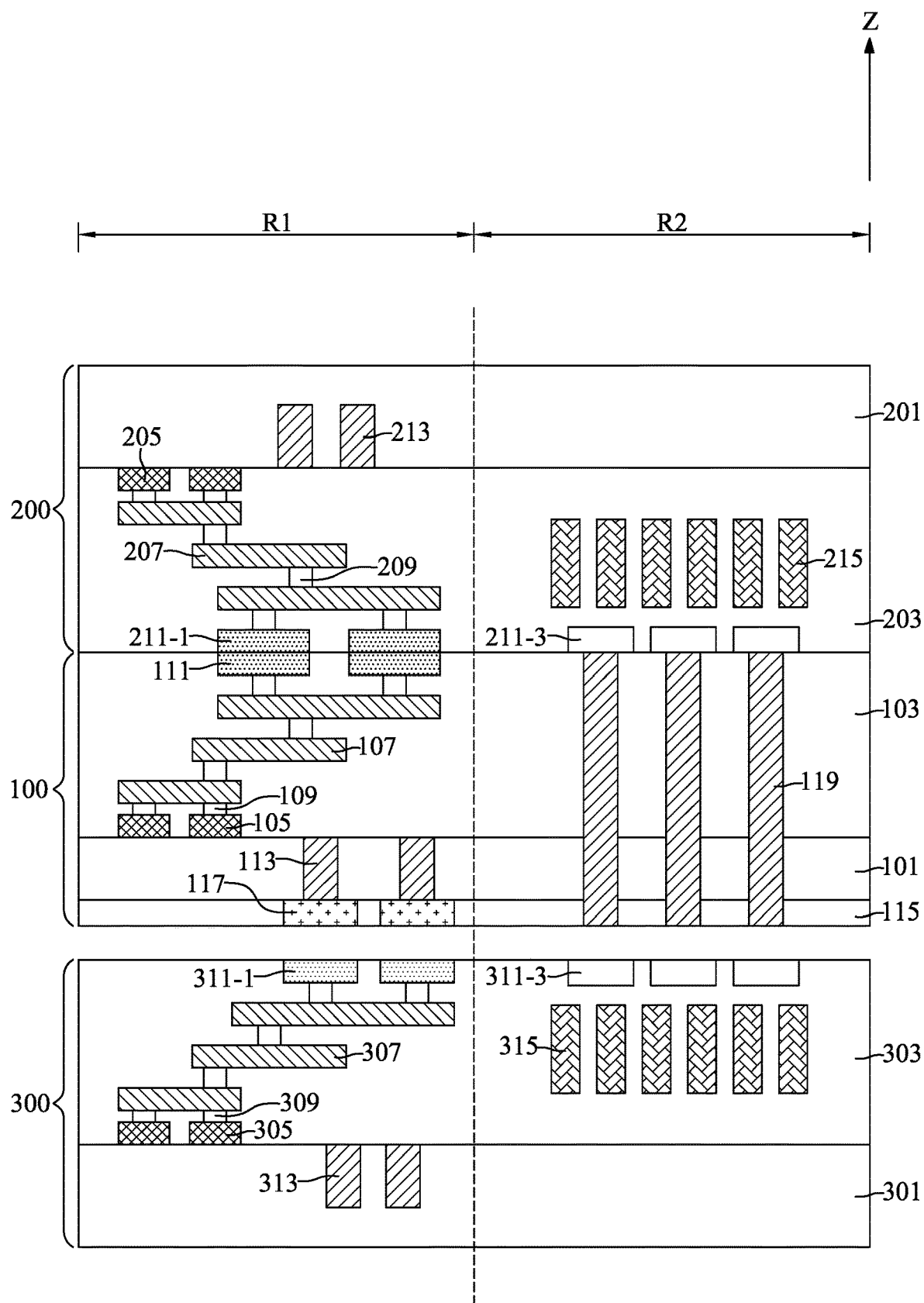

With reference to FIGS. 1, 8, and 9, at step S21, the second semiconductor die 200 may be flipped and may be bonded onto the first circuit layer 103 to electrically connect the plurality of second conductive pads 211-1, 211-3 to the plurality of first conductive pads 111 and the plurality of through die vias 119.

With reference to FIG. 8, in some embodiments, the second semiconductor die 200 may be flipped and moved over the first semiconductor die 100. The plurality of second conductive pads 211-1 may be disposed directly above the plurality of first conductive pads 111. The plurality of second conductive pads 211-3 may be disposed directly above the plurality of through die vias 119. In some embodiments, the second semiconductor die 200 may be flipped and moved with the assistance of a second carrier substrate (not shown). The second carrier substrate may be removed after the bonding of the first semiconductor die 100 and the second semiconductor die 200.

With reference to FIG. 9, after the bonding of the first semiconductor die 100 and the second semiconductor die 200. The plurality of second conductive pads 211-1 may directly contact the plurality of first conductive pads 111 and may be electrically connected to the plurality of first conductive pads 111. The plurality of second conductive pads 211-3 may directly contact the plurality of through die vias 119 and may be electrically connected to the plurality of through die vias 119.

In some embodiments, the second semiconductor die 200 may be bonded onto the first circuit layer 103 in a face-to-face configuration through a hybrid bonding process such as thermo-compression bonding, passivation-capping-layer assisted bonding, or surface activated bonding. In some embodiments, the process pressure of the hybrid bonding process may be between about 100 MPa and about 150 MPa. In some embodiments, the process temperature of the hybrid bonding process may be between about room temperature (e.g., 25° C.) and about 400° C. In some embodiments, surface treatments such as wet chemical cleaning and gas/vapor-phase thermal treatments may be used to lower the process temperature of the hybrid bonding process or to short the time consuming of the hybrid bonding process.

In some embodiments, the hybrid bonding process may include dielectric-to-dielectric bonding, metal-to-metal bonding, and metal-to-dielectric bonding. The dielectric-to-dielectric bonding may originate from the bonding between the inter-layer dielectric layers of the first circuit layer 103 and the inter-layer dielectric layers of the second circuit layer 203. The metal-to-metal bonding may originate from the bonding between the plurality of first conductive pads 111 and the plurality of second conductive pads 211-1, and between the plurality of through die vias 119 and the plurality of second conductive pads 211-3. The metal-to-dielectric bonding may originate from the bonding between the inter-layer dielectric layers of the first circuit layer 103 and the plurality of second conductive pads 211-3.

In some embodiments, when the inter-layer dielectric layers of the first circuit layer 103 and the second circuit layer 203 are formed of, for example, silicon oxide or silicon nitride, the bonding between the inter-layer dielectric layers may be based on the hydrophilic bonding mechanism. Hydrophilic surface modifications may be applied to the inter-layer dielectric layers before bonding.

In some embodiments, a thermal annealing process may be performed after the bonding process to enhance dielectric-to-dielectric bonding and to induce thermal expansion of metal-to-metal bonding so as to further improve the bonding quality.

Figure 10:
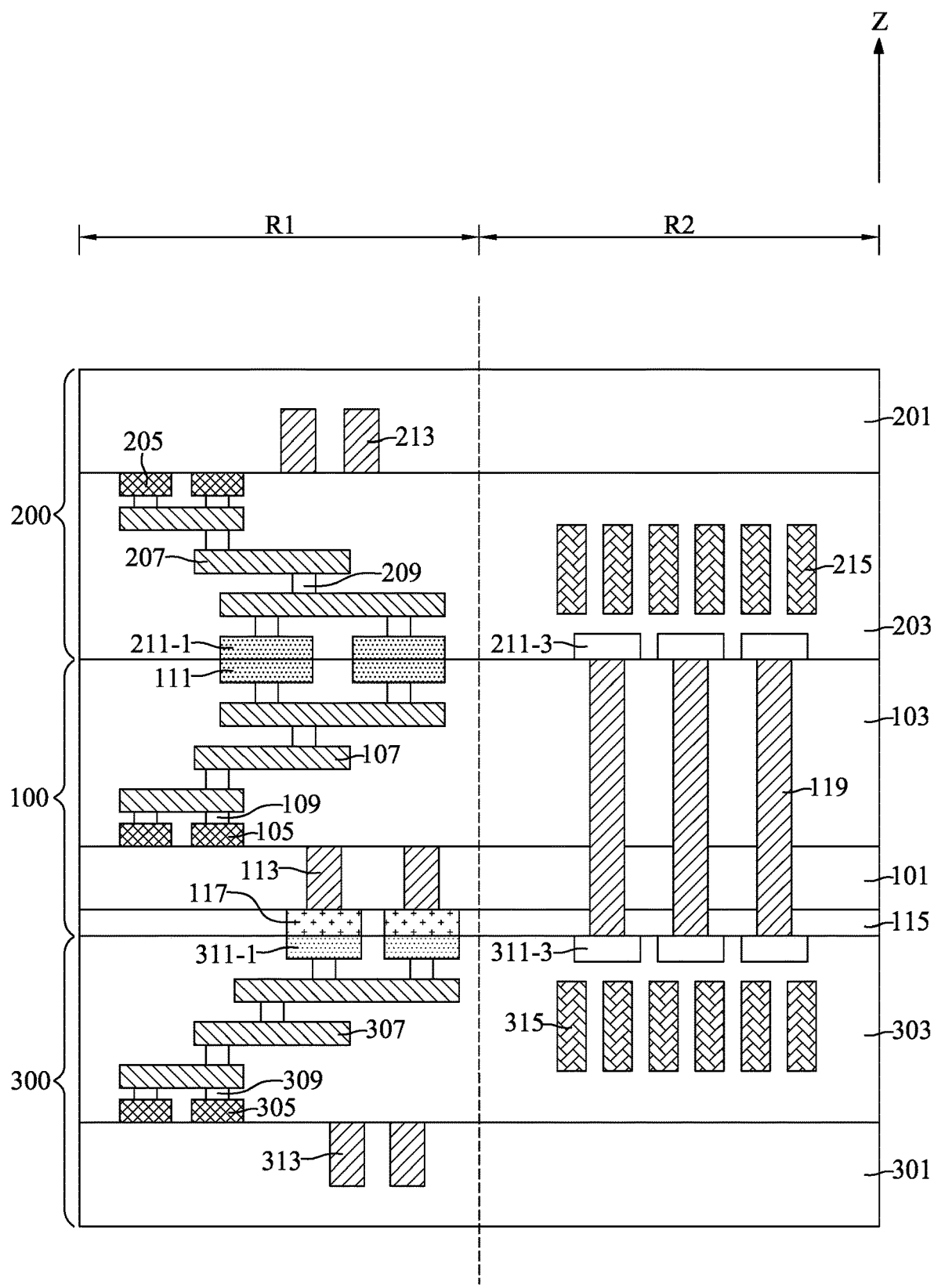

With reference to FIGS. 1, 9, and 10, at step S23, the first semiconductor die 100 may be bonded onto the third semiconductor die 300 to electrically connect the plurality of third conductive pads 311-1, 311-3 to the plurality of first bottom conductive pads 117 and the plurality of through die vias 119.

With reference to FIG. 9, the plurality of first bottom conductive pads 117 may be disposed directly above the plurality of third conductive pads 311-1. The plurality of through die vias 119 may be disposed directly above the plurality of third conductive pads 311-3. In some embodiments, the intermediate semiconductor device configured by the first semiconductor die 100 and the second semiconductor die 200 may be moved with the assistance of a third carrier substrate (not shown) attached on the second substrate 201. The third carrier substrate may be removed after the bonding of the first semiconductor die 100 and the third semiconductor die 300.

With reference to FIG. 10, after the bonding of the first semiconductor die 100 and the third semiconductor die 300. The plurality of third conductive pads 311-1 may directly contact the plurality of first bottom conductive pads 117 and may be electrically connected to the plurality of first bottom conductive pads 117. The plurality of third conductive pads 311-3 may directly contact the plurality of through die vias 119 and may be electrically connected to the plurality of through die vias 119. The bonding between the first semiconductor die 100 and the third semiconductor die 300 may be similar to the bonding between the first semiconductor die 100 and the second semiconductor die 200, and descriptions thereof are not repeated herein. In some embodiments, the plurality of first bottom conductive pads 117 may be omitted. The plurality of first through substrate vias 113 may directly contact the plurality of third conductive pads 311-1.

In some embodiments, a thinning process may be performed after the bonding of the first semiconductor die 100 and the third semiconductor die 300 to reduce a thickness of the third substrate 301 so as to reduce the height of the semiconductor device 1A. This thinning process may allow for improved thermal dissipation and provide for a lower device profile. Alternatively, in some embodiments, the thinning process for the third substrate 301 may be omitted.

In some embodiments, the third substrate 301 may be thinned to a thickness between about 0.5 µm and about 10 µm. The thinning process may be accomplished, e.g., using mechanical abrasion, polishing, or the like, or using chemical removal, such as a wet etch. An advantageous, but not limiting, feature of the illustrated embodiment is that by bonding the first semiconductor die 100 and the third semiconductor die 300 prior to thinning, a carrier substrate may not be required to provide support during bonding. The lack of a carrier substrate may lower manufacturing costs and increase yield.

The plurality of through die vias 119, the plurality of second conductive pads 211-1, 211-3, and the plurality of third conductive pads 311-1, 311-3 together configure a plurality of transmission channels through which the control circuit is capable to access the second semiconductor die 200 and the third semiconductor die 300.

Figure 11:
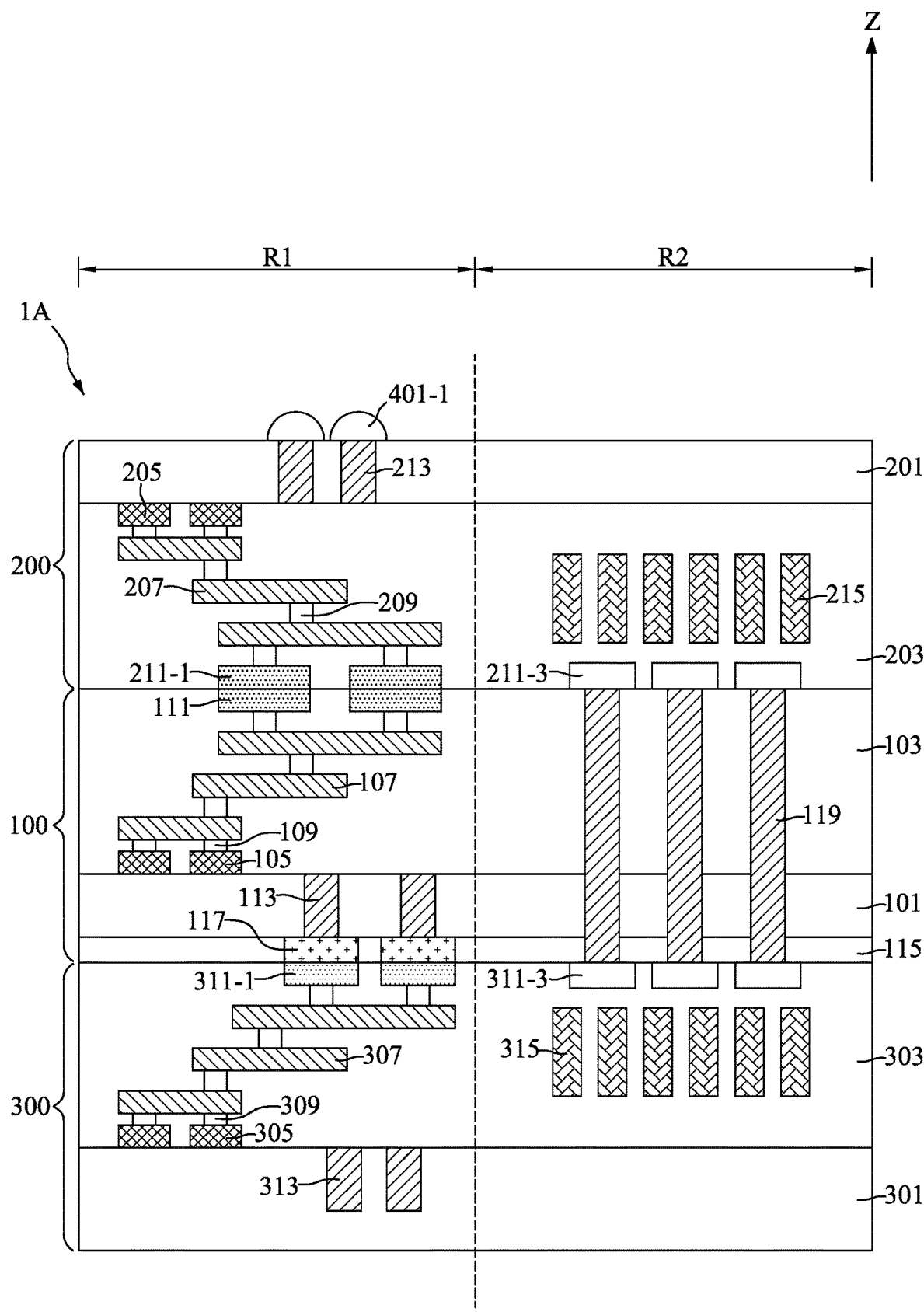

With reference to FIGS. 1 and 11, at step S25, a plurality of connectors 401-1 may be formed on the second substrate 201 to electrically connect to the plurality of second through substrate vias 213.

With reference to FIG. 11, a thinning process may be performed to expose the plurality of second through substrate vias 213. The thinning process may be accomplished, e.g., using mechanical abrasion, polishing, or the like, or using chemical removal, such as a wet etch.

The plurality of connectors 401-1 may be respectively correspondingly formed on the plurality of second through substrate vias 213. In some embodiments, the plurality of connectors 401-1 may include a conductive material with low resistivity, such as tin, lead, silver, copper, nickel, bismuth or an alloy thereof, and may be formed by a suitable process such as evaporation, plating, ball drop, or screen printing. In some embodiments, the plurality of connectors 401-1 may be controlled collapse chip connection (i.e., C4) bumps formed by a C4 process.

In some embodiments, the plurality of connectors 401-1 may be solder joints. The solder joints may comprise a material such as tin, or other suitable materials, such as silver or copper. In an embodiment in which the solder joints are tin solder joints, the solder joints may be formed by initially forming a layer of tin through evaporation, electroplating, printing, solder transfer, or ball placement to a thickness of about 10 µm to about 100 µm. Once the layer of tin has been formed on the second substrate 201, a reflow process may be performed to shape the solder joints into the desired shape.

In some embodiments, the plurality of connectors 401-1 may be pillar bumps formed of, for example, copper. The pillar bumps may be formed directly on the second substrate 201, without requiring contact pads, under bump metallization, or the like, thus further reducing cost and process complexity of the semiconductor device 1A, which may allow for increased density of pillar bumps. For example, in some embodiments, a critical dimension of a pillar bump (e.g., pitch) may be less than about 5 µm, and the pillar bump may have a height less than about 10 µm. The pillar bumps may be formed using any suitable method, such as, depositing a seed layer, optionally forming an under bump metallurgy, using a mask to define a shape of the pillar bumps, electro-chemically plating the pillar bumps in the mask, and subsequently removing the mask and any undesired portions of the seed layer. The pillar bumps may be used to electrically connect the semiconductor device 1A to other package components such as, a fan-out redistribution layer, package substrates, interposers, printed circuit boards, and the like.

Figure 12:
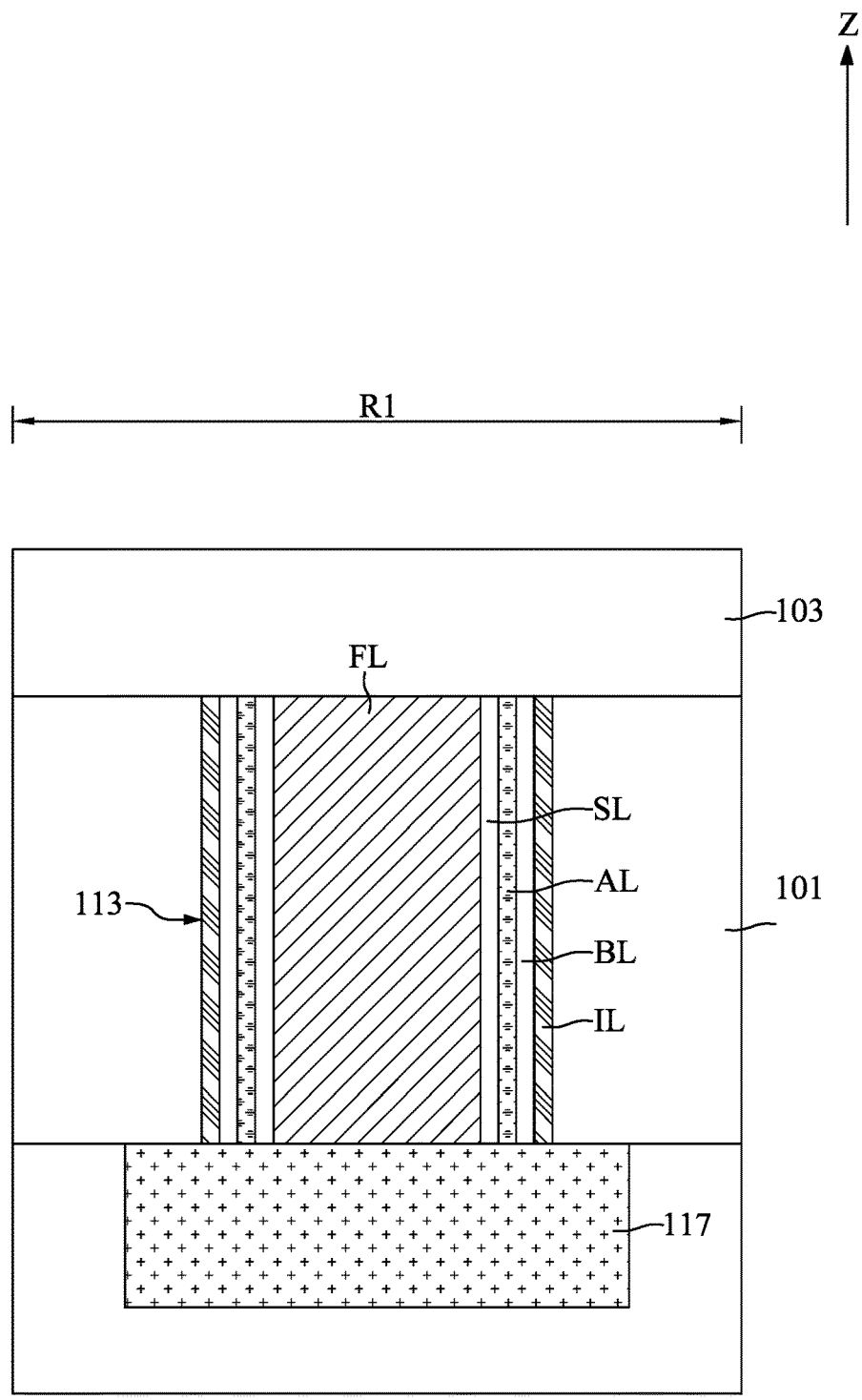
FIG. 12 illustrates, in a close-up schematic cross-sectional view diagram, part of the semiconductor device in accordance with one embodiment of the present disclosure.

FIG. 12 illustrates, in a close-up schematic cross-sectional view diagram, part of the semiconductor device 1A in accordance with one embodiment of the present disclosure.

With reference to FIG. 12, the first through substrate via 113 may include a filler layer FL, two seed layers SL, two adhesion layers AL, two barrier layers BL, and two isolation layers IL.

With reference to FIG. 12, the filler layer FL may be disposed along the first substrate 101. The filler layer FL may be, for example, copper. The two isolation layers IL may be disposed on the two sides of the filler layer FL. In some embodiments, the two isolation layers IL may be formed of, for example, silicon oxide, silicon nitride, silicon oxynitride, or tetra-ethyl ortho-silicate. The two isolation layers IL may respectively have a thickness between about 50 nm and about 200 nm. Alternatively, in some embodiments, the two isolation layers IL may be formed of, for example, parylene, epoxy, or poly(p-xylene). The two isolation layers IL may respectively have a thickness between about 1 µm and about 5 µm. The two isolation layers IL may ensure the filler layer FL is electrically isolated in the first substrate 101.

With reference to FIG. 12, the two barrier layers BL may be disposed between the filler layer FL and the two isolation layers IL. The two barrier layers BL may be formed of, for example, tantalum, tantalum nitride, titanium, titanium nitride, rhenium, nickel boride, or tantalum nitride/tantalum bilayer. The two barrier layers BL may inhibit diffusion of the conductive materials of the filler layer FL into the two isolation layers IL and the first substrate 101. The two barrier layers BL may be formed by a deposition process such as physical vapor deposition, atomic layer deposition, chemical vapor deposition, or sputtering.

With reference to FIG. 12, the two adhesion layers AL may be disposed between the filler layer FL and the two barrier layers BL. The two adhesion layers AL may be formed of, for example, titanium, tantalum, titanium tungsten, or manganese nitride. The two adhesion layers AL may improve an adhesion between the two seed layers SL and the two barrier layers BL. The two adhesion layers AL may respectively have a thickness between about 5 nm and about 50 nm. The two adhesion layers AL may be formed by a deposition process such as physical vapor deposition, atomic layer deposition, chemical vapor deposition, or sputtering.

With reference to FIG. 12, the two seed layers SL may be disposed between the filler layer FL and the two adhesion layers AL. The two seed layers SL may respectively have a thickness between about 10 nm and about 40 nm. The two seed layers SL may be formed of, for example, copper or ruthenium. The two seed layers SL may be formed by a deposition process such as physical vapor deposition, atomic layer deposition, chemical vapor deposition, or sputtering. The two seed layers SL may reduce resistivity during the formation of the filler layer FL by an electroplating process.

In some embodiments, the through die via 119, the second through substrate via 213, and the third through substrate via 313 may have the same structure as the first through substrate via 113 illustrated in FIG. 12.

FIGS. 13 to 16 illustrate, in schematic cross-sectional view diagrams, semiconductor devices 1B, 1C, 1D, and 1E in accordance with some embodiments of the present disclosure.

Figure 13:
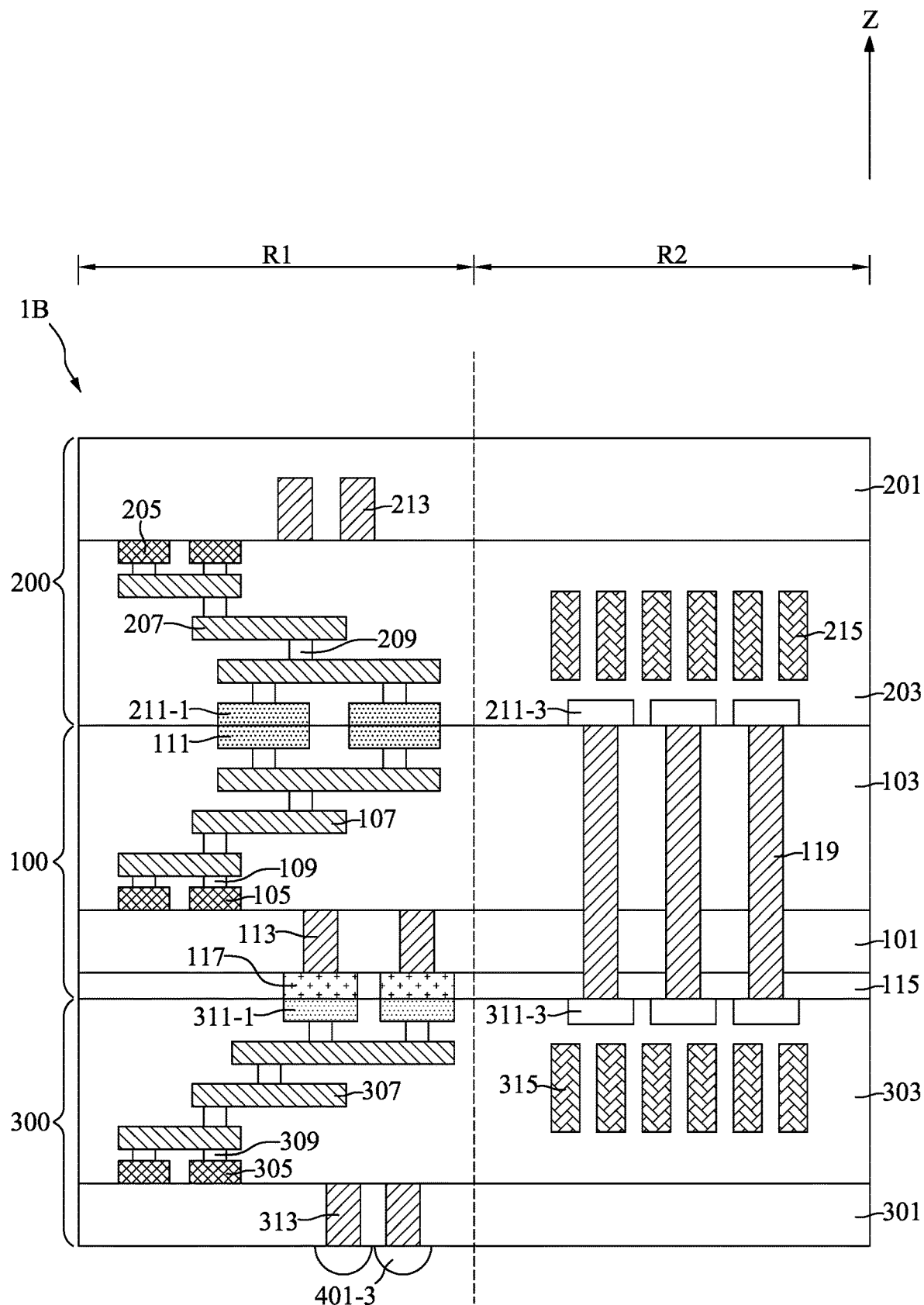
FIGS. 13 to 16 illustrate, in schematic cross-sectional view diagrams, semiconductor devices in accordance with some embodiments of the present disclosure.

With reference to FIG. 13, the semiconductor device 1B may have a structure similar to that illustrated in FIG. 11. The same or similar elements in FIG. 13 as in FIG. 11 have been marked with similar reference numbers and duplicative descriptions have been omitted.

With reference to FIG. 13, the third substrate 301 may be thinned to expose the plurality of third through substrate vias 313 with a procedure similar to that illustrated in FIG. 11. A plurality of connectors 401-3 may be disposed under the plurality of third through substrate vias 313 and electrically connect to the plurality of third through substrate vias 313. The plurality of connectors 401-3 may have a similar structure as the plurality of connectors 401-1 and may be formed of a similar material as the plurality of connectors 401-1, and descriptions thereof are not repeated herein.

Figure 14:
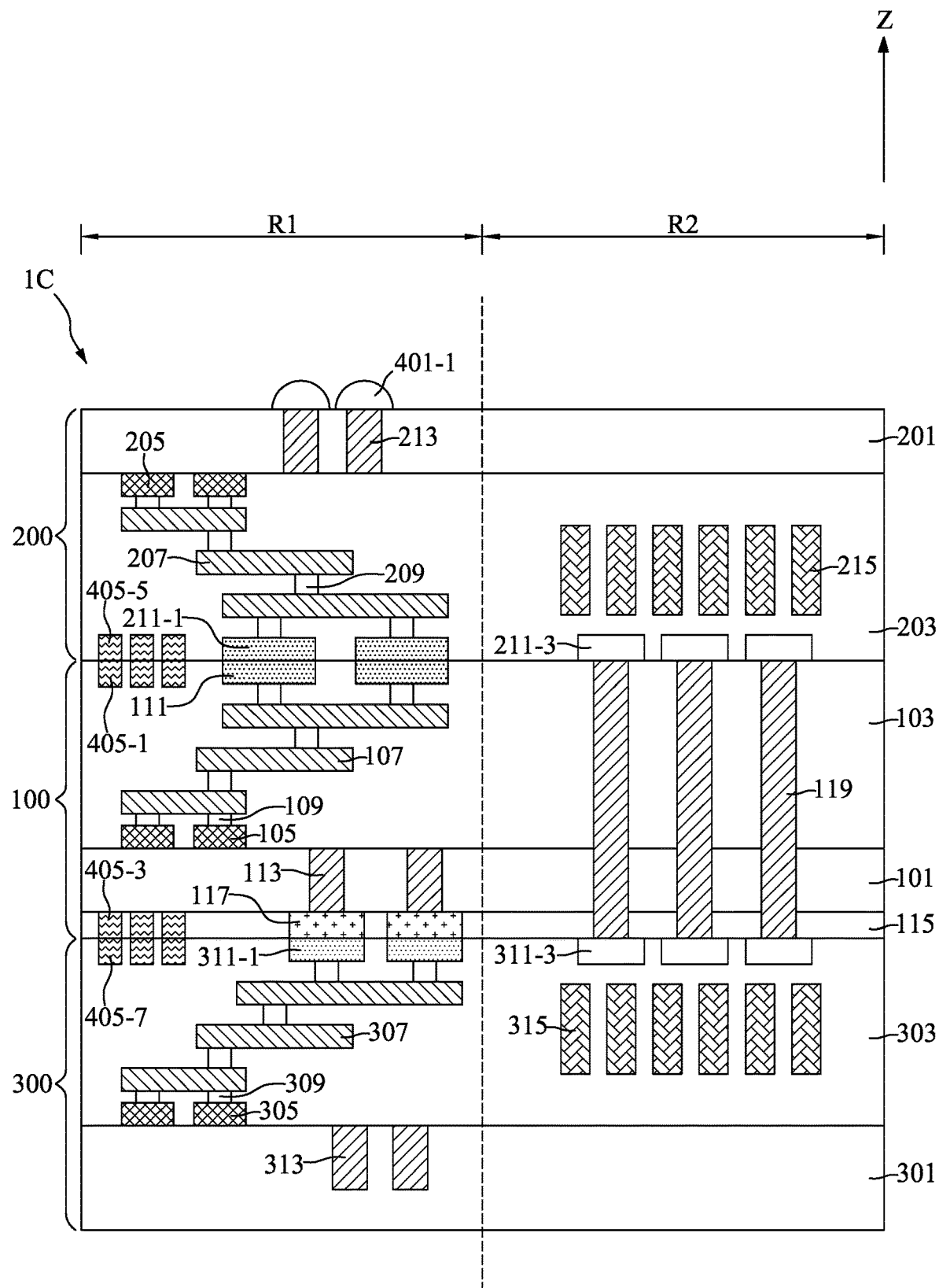

With reference to FIG. 14, the semiconductor device 1C may have a structure similar to that illustrated in FIG. 11. The same or similar elements in FIG. 14 as in FIG. 11 have been marked with similar reference numbers and duplicative descriptions have been omitted.

With reference to FIG. 14, a plurality of first dummy conductive pads 405-1 may be disposed in the first circuit layer 103 and may be substantially coplanar with the top surface of the first circuit layer 103. A plurality of second dummy conductive pads 405-3 may be disposed in the first bottom passivation layer 115 and may be substantially coplanar with the bottom surface of the first bottom passivation layer 115. A plurality of third dummy conductive pads 405-5 may be disposed in the second circuit layer 203, may be substantially coplanar with the bottom surface of the second circuit layer 203, and directly contacting the plurality of first dummy conductive pads 405-1. A plurality of fourth dummy conductive pads 405-7 may be disposed in the third circuit layer 303, substantially coplanar with the top surface of the third circuit layer 303, and directly contacting the plurality of second dummy conductive pads 405-3. The dummy conductive pads 405-1, 405-3, 405-5, 405-7 may be formed of, for example, a conductive material such as copper, aluminum, or alloy thereof. The dummy conductive pads 405-1, 405-3, 405-5, 405-7 may provide additional metal-to-metal bonding to improve the bonding quality between the first semiconductor die 100 and the second semiconductor die 200 and between the first semiconductor die 100 and the third semiconductor die 300.

It should be noted that referring to an element as a "dummy" element means that no exterior voltage or current is applied to the element when the semiconductor device is in operation.

Figure 15:
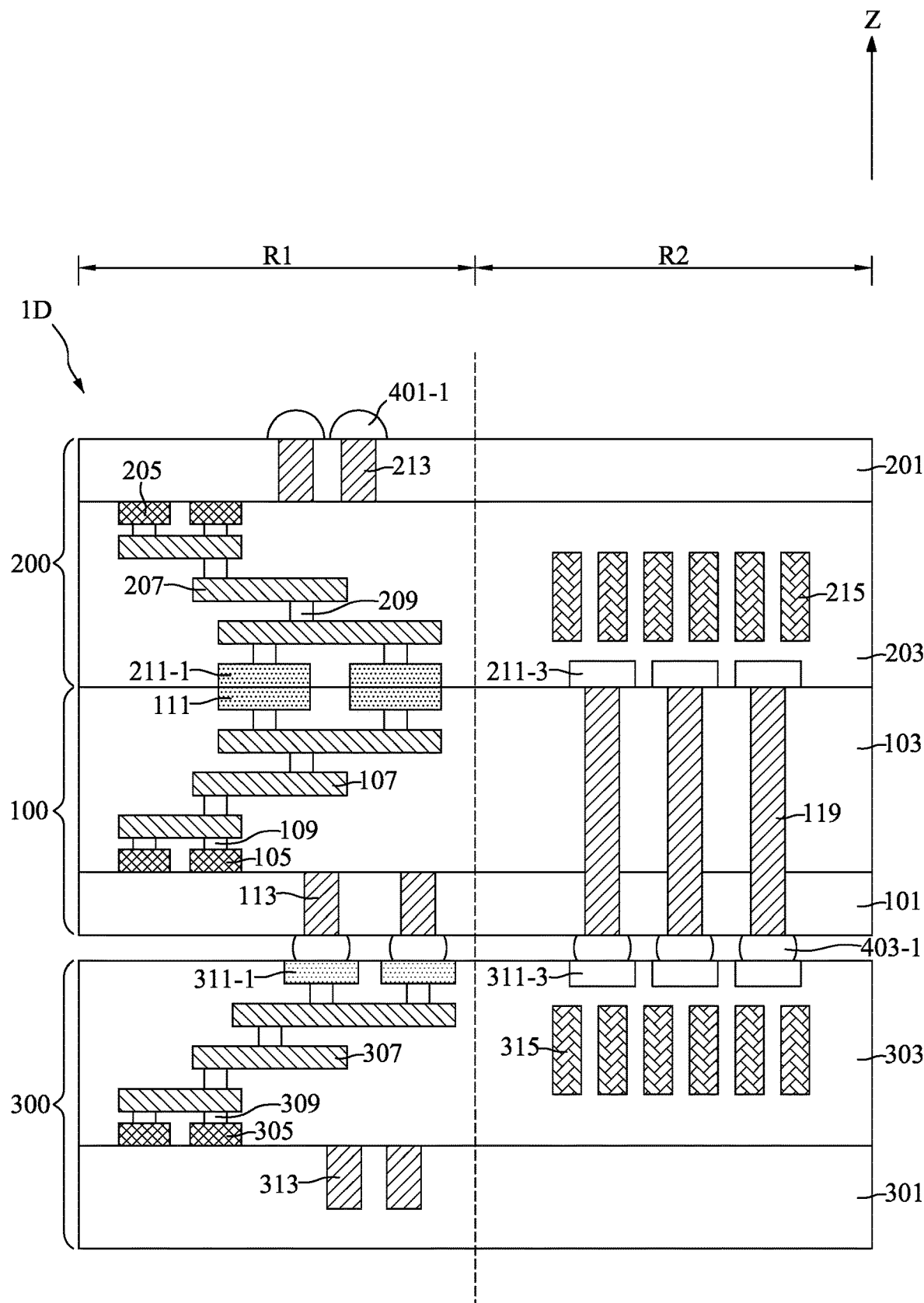

With reference to FIG. 15, the semiconductor device 1D may have a structure similar to that illustrated in FIG. 11. The same or similar elements in FIG. 15 as in FIG. 11 have been marked with similar reference numbers and duplicative descriptions have been omitted.

With reference to FIG. 15, the first semiconductor die 100 and the third semiconductor die 300 may not be bonded directly. For example, the first semiconductor die 100 and the third semiconductor die 300 may be bonded through the plurality of micro-connectors 403-1. The plurality of micro-connectors 403-1 may be disposed between the first through substrate via 113 and the third conductive pad 311-1 and between the through die via 119 and the third conductive pad 311-3. The plurality of micro-connectors 403-1 may have a structure similar to the plurality of connectors 401-1 and may be formed of a similar material as the plurality of connectors 401-1, and descriptions thereof are not repeated herein.

Figure 16:
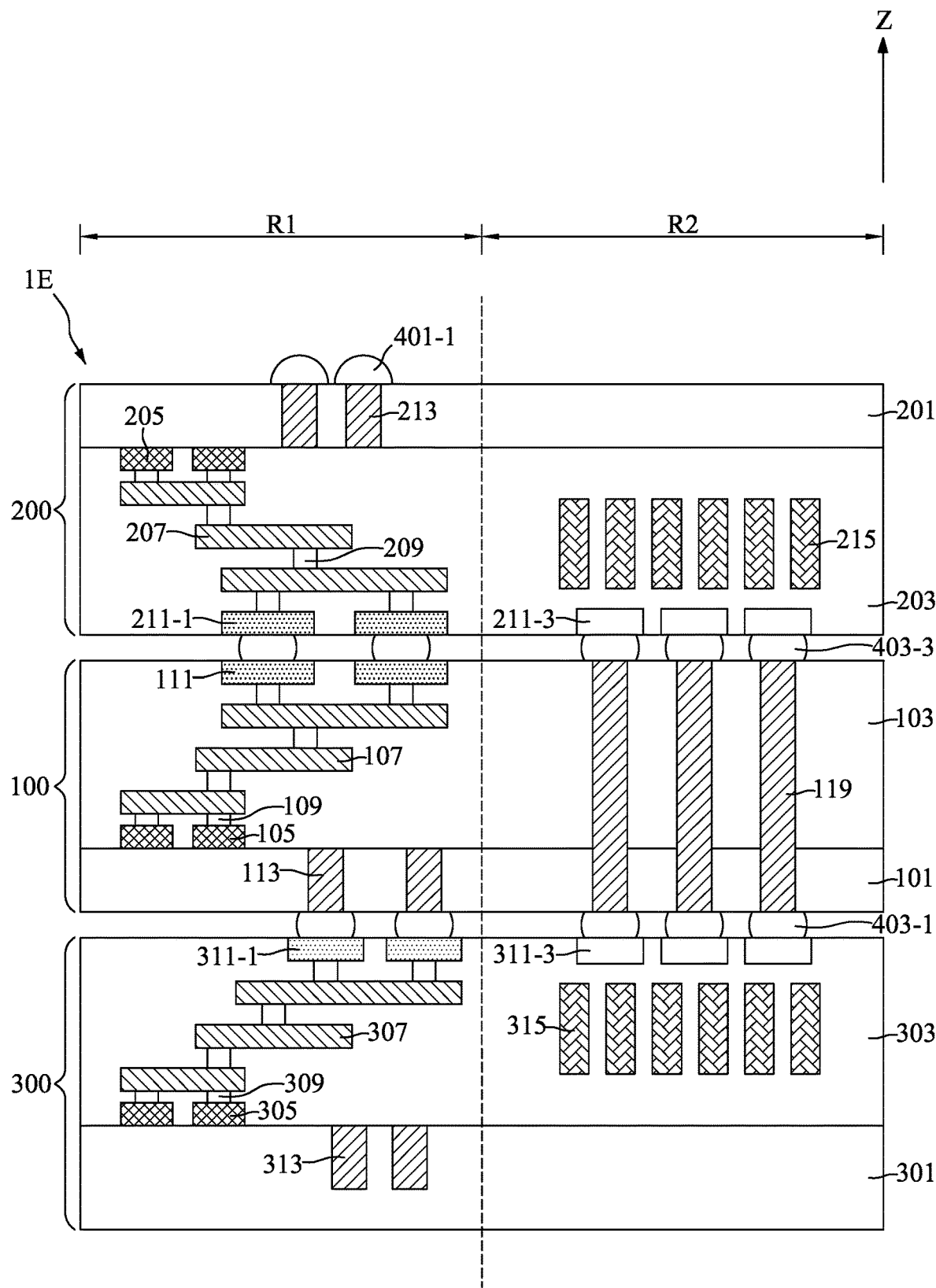

With reference to FIG. 16, the semiconductor device 1E may have a structure similar to that illustrated in FIG. 15. The same or similar elements in FIG. 16 as in FIG. 15 have been marked with similar reference numbers and duplicative descriptions have been omitted.

With reference to FIG. 16, the first semiconductor die 100 and the second semiconductor die 200 may not be bonded directly. For example, the first semiconductor die 100 and the second semiconductor die 200 may be bonded through the plurality of micro-connectors 403-3. The plurality of micro-connectors 403-3 may be disposed between the first conductive pad 111 and the second conductive pad 211-1 and between the through die via 119 and the second conductive pad 211-3. The plurality of micro-connectors 403-3 may have a structure similar to the plurality of connectors 401-1 and may be formed of a similar material as the plurality of connectors 401-1, and descriptions thereof are not repeated herein.

One aspect of the present disclosure provides a semiconductor device including a first semiconductor die including a first substrate including a first region and a second region, a first circuit layer positioned on the first substrate, a control circuit positioned on the first region of the first substrate and positioned in the first circuit layer; and a plurality of through die vias vertically positioned along the first circuit layer and the second region of the first substrate; a second semiconductor die stacked on the first semiconductor die and including a plurality of second conductive pads respectively electrically connected to the plurality of through die vias and the control circuit; and a third semiconductor die stacked under the first semiconductor die and including a plurality of third conductive pads respectively electrically connected to the plurality of through die vias and the control circuit; wherein the plurality of through die vias, the plurality of second conductive pads, and the plurality of third conductive pads together configure a plurality of transmission channels through which the control circuit is capable to access the second semiconductor die and the third semiconductor die.

Another aspect of the present disclosure provides a method for fabricating a semiconductor device including providing a first semiconductor die including a first substrate including a first substrate including a first region and a second region, a plurality of first through substrate vias in the first region of the first substrate, a first circuit layer on the first substrate, and a control circuit on the first region of the first substrate and in the first circuit layer; forming a plurality of through die vias vertically along the first circuit layer and the second region of the first substrate; providing a second semiconductor die including a plurality of second conductive pads substantially coplanar with a top surface of the second semiconductor die; providing a third semiconductor die including a plurality of third conductive pads substantially coplanar with a top surface of the third semiconductor die; flipping the second semiconductor die and bonding the second semiconductor die onto the first circuit layer to electrically connect the plurality of second conductive pads to the control circuit and the plurality of through die vias; and bonding the first semiconductor die onto the third semiconductor die to electrically connect the control circuit and the plurality of through die vias to the plurality of third conductive pads.

Due to the design of the semiconductor device of the present disclosure, the electrical paths between different dies may be significantly reduced. Therefore, the power consumption of the semiconductor device 1A may be reduced. In addition, separating the control circuit from the memory dies (e.g., the second semiconductor die 200 and the third semiconductor die 300) may reduce the complexity of manufacturing of the memory dies. Besides, the control circuit may be fabricated with a process that yields power-efficient high-speed circuitry. As a result, the overall manufacturing efficiency may be improved, and the overall manufacturing complexity may be reduced.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A method for fabricating a semiconductor device, comprising:
    providing a first semiconductor die comprising a first substrate comprising a first region and a second region, a plurality of first through substrate vias in the first region of the first substrate, a first circuit layer on the first substrate, and a control circuit on the first region of the first substrate and in the first circuit layer;
    forming a plurality of through die vias vertically along the first circuit layer and the second region of the first substrate;
    providing a second semiconductor die comprising a plurality of second conductive pads substantially coplanar with a top surface of the second semiconductor die;
    providing a third semiconductor die comprising a plurality of third conductive pads substantially coplanar with a top surface of the third semiconductor die;
    flipping the second semiconductor die and bonding the second semiconductor die onto the first circuit layer to electrically connect the plurality of second conductive pads to the control circuit and the plurality of through die vias;
    bonding the first semiconductor die onto the third semiconductor die to electrically connect the control circuit and the plurality of through die vias to the plurality of third conductive pads, wherein the second semiconductor die and the third semiconductor die are memory dies;
    forming a plurality of first through substrate vias in the first substrate and electrically connected to the control circuit; and
    performing a thinning process to reduce a thickness of the first substrate and expose the plurality of first through substrate vias, forming a first bottom passivation layer to cover the first substrate and the plurality of first through substrate vias, and forming a plurality of first bottom conductive pads in the first bottom passivation layer to electrically connect to the plurality of first through substrate vias; wherein the plurality of through die vias are formed vertically along the first circuit layer, the second region of the first substrate, and the first bottom passivation layer; wherein the plurality of first bottom conductive pads are electrically connected to the plurality of third conductive pads.

2. The method for fabricating the semiconductor device of claim 1, wherein the first bottom passivation layer comprises polybenzoxazole, polyimide, benzocyclobutene, ajinomoto buildup film, solder resist film, silicon nitride, silicon oxide, silicon oxynitride, silicon nitride oxide, phosphosilicate glass, borosilicate glass, or boron-doped phosphosilicate glass.

* * * * *